(12) United States Patent
Okano et al.

(10) Patent No.: US 9,142,593 B2
(45) Date of Patent: Sep. 22, 2015

(54) DISPLAY DEVICE

(71) Applicant: SEMICONDUCTOR ENERGY LABORATORY CO., LTD., Atsugi-shi, Kanagawa-ken (JP)

(72) Inventors: Shinya Okano, Shizuoka (JP); Shigeru Onoya, Kanagawa (JP); Seiko Inoue, Kanagawa (JP); Masaaki Hiroki, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/471,157

(22) Filed: Aug. 28, 2014

(65) Prior Publication Data

US 2015/0060896 A1 Mar. 5, 2015

(30) Foreign Application Priority Data

Aug. 30, 2013 (JP) ................................. 2013-178799
Oct. 22, 2013 (JP) ................................. 2013-218887

(51) Int. Cl.
*H01L 27/32* (2006.01)
*H01L 27/15* (2006.01)
*H01L 29/786* (2006.01)
*H01L 51/50* (2006.01)

(52) U.S. Cl.
CPC ...... *H01L 27/153* (2013.01); *G09G 2300/0809* (2013.01); *G09G 2300/0814* (2013.01); *H01L 51/50* (2013.01)

(58) Field of Classification Search
CPC ... H01L 27/15; H01L 27/153; H01L 51/0032; H01L 51/50; H01L 51/5012; H01L 51/52–51/5234; G09G 2300/04–2300/0408; G09G 2300/0421–2300/043; G09G 2300/0469; G09G 2300/08–2300/0814; G09G 2300/0842
See application file for complete search history.

(56) References Cited

U.S. PATENT DOCUMENTS

| 5,731,856 A | 3/1998 | Kim et al. |
| 5,744,864 A | 4/1998 | Cillessen et al. |
| 6,294,274 B1 | 9/2001 | Kawazoe et al. |
| 6,380,689 B1 * | 4/2002 | Okuda ........................ 315/169.3 |
| 6,563,174 B2 | 5/2003 | Kawasaki et al. |

(Continued)

FOREIGN PATENT DOCUMENTS

| EP | 1737044 A | 12/2006 |
| EP | 2226847 A | 9/2010 |

(Continued)

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Laura Menz
*Assistant Examiner* — Maliheh Malek
(74) *Attorney, Agent, or Firm* — Fish & Richardson P.C.

(57) ABSTRACT

To suppress a loss of data in a semiconductor device. To provide a display device including a capacitor storing data, a display element performing display in accordance with the data, and switching elements connected to electrodes of the capacitor. In the display device, the voltage is held between the electrodes of the capacitor by turning the switching elements off; thus, the data can be stored even when supplying the power supply is stopped.

19 Claims, 19 Drawing Sheets

(56) References Cited

U.S. PATENT DOCUMENTS

| | | | |
|---|---|---|---|
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,039,841 B2 * | 10/2011 | Park | 257/59 |
| 8,207,916 B2 * | 6/2012 | Osame et al. | 345/76 |
| 8,242,986 B2 | 8/2012 | Kimura | |
| 8,264,430 B2 * | 9/2012 | Kimura | 345/76 |
| 8,325,111 B2 * | 12/2012 | Kimura | 345/76 |
| 8,378,341 B2 | 2/2013 | Hayashi et al. | |
| 8,519,392 B2 * | 8/2013 | Yamazaki et al. | 257/57 |
| 8,547,771 B2 | 10/2013 | Koyama | |
| 8,659,517 B2 * | 2/2014 | Osame et al. | 345/76 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2002/0180671 A1 * | 12/2002 | Inukai | 345/76 |
| 2003/0058687 A1 * | 3/2003 | Kimura | 365/177 |
| 2003/0062545 A1 * | 4/2003 | Yamazaki et al. | 257/200 |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2004/0263441 A1 * | 12/2004 | Tanaka et al. | 345/76 |
| 2005/0017302 A1 | 1/2005 | Hoffman | |
| 2005/0030265 A1 | 2/2005 | Miyagawa | |
| 2005/0134189 A1 * | 6/2005 | Osame et al. | 315/169.1 |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0044229 A1 * | 3/2006 | Yamazaki et al. | 345/76 |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0170634 A1 * | 8/2006 | Kwak et al. | 345/92 |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0065957 A1 * | 3/2007 | Fujii et al. | 438/16 |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 * | 6/2008 | Ishizaki et al. | 313/504 |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0009676 A1 * | 1/2009 | Kimura et al. | 349/43 |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0171685 A1 * | 7/2010 | Kimura | 345/76 |
| 2010/0182226 A1 * | 7/2010 | Umezaki | 345/98 |
| 2011/0003429 A1 * | 1/2011 | Oikawa et al. | 438/104 |
| 2011/0003430 A1 * | 1/2011 | Yamazaki et al. | 438/104 |
| 2011/0012112 A1 * | 1/2011 | Yamazaki et al. | 257/57 |
| 2011/0108837 A1 * | 5/2011 | Yamazaki et al. | 257/43 |
| 2011/0199365 A1 * | 8/2011 | Umezaki et al. | 345/212 |
| 2011/0210325 A1 * | 9/2011 | Sakakura et al. | 257/43 |
| 2011/0210355 A1 * | 9/2011 | Yamazaki et al. | 257/98 |
| 2011/0261043 A1 * | 10/2011 | Hayakawa et al. | 345/211 |
| 2012/0161536 A1 * | 6/2012 | Kamata et al. | 307/104 |
| 2012/0218238 A1 * | 8/2012 | Yamazaki et al. | 345/207 |
| 2012/0274614 A1 * | 11/2012 | Kimura et al. | 345/204 |
| 2012/0287025 A1 * | 11/2012 | Inoue et al. | 345/76 |
| 2013/0021316 A1 * | 1/2013 | Inoue et al. | 345/212 |
| 2013/0063041 A1 * | 3/2013 | Kimura | 315/291 |
| 2013/0092930 A1 * | 4/2013 | Kimura | 257/43 |
| 2013/0321248 A1 * | 12/2013 | Kimura | 345/76 |
| 2013/0321249 A1 * | 12/2013 | Kimura | 345/76 |
| 2013/0321371 A1 * | 12/2013 | Koyama | 345/209 |
| 2014/0240631 A1 * | 8/2014 | Shishido et al. | 349/43 |
| 2014/0291640 A1 * | 10/2014 | Miyake | 257/40 |
| 2014/0333596 A1 * | 11/2014 | Yang et al. | 345/209 |
| 2014/0340363 A1 * | 11/2014 | Ikeda et al. | 345/175 |
| 2014/0361290 A1 * | 12/2014 | Yamazaki et al. | 257/43 |
| 2014/0361316 A1 * | 12/2014 | Nozawa et al. | 257/88 |
| 2015/0022957 A1 | 1/2015 | Hiroki et al. | 361/679.01 |
| 2015/0035777 A1 * | 2/2015 | Hirakata et al. | 345/173 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |

(56) References Cited

FOREIGN PATENT DOCUMENTS

| | | |
|---|---|---|
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2010-141230 | 6/2010 |
| JP | 2012-257187 | 12/2012 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFSPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008. pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TF", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties"SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest 07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn]at temperatures over 1000° C.", Journal of Solid State Chemistry, 198, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (M=7,8,9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World'S Largest (15-Inch) XDA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide—Based Thin-Film Transistors by DC Sputtering", SID Digest 09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four Dimensional Superspace Group", Journal of Solid State Chemistry, 1998, vol. 139, pp. 347-355.

Masuda.S et al., "Transparent thin film transistors using ZnO as an active channel layer and their electrical properties". J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

(56) References Cited

OTHER PUBLICATIONS

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transitors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

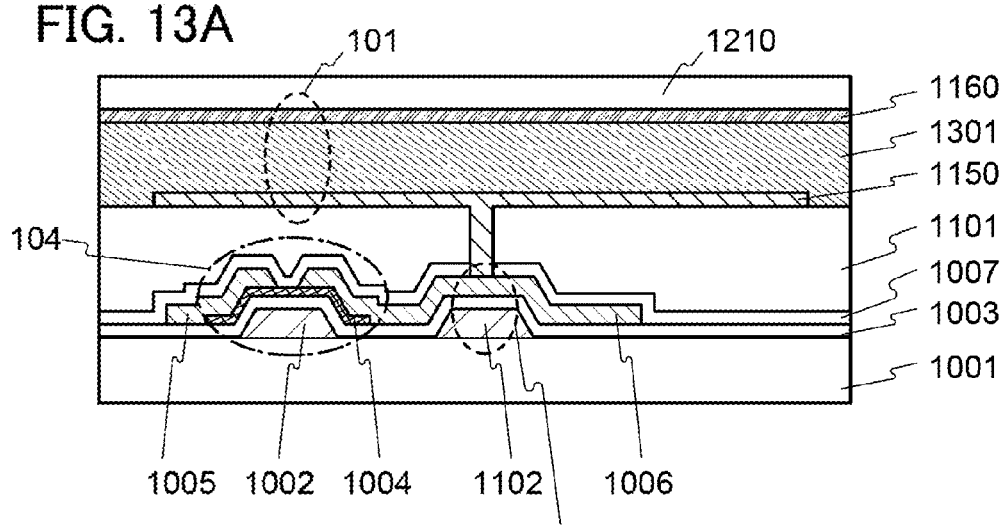
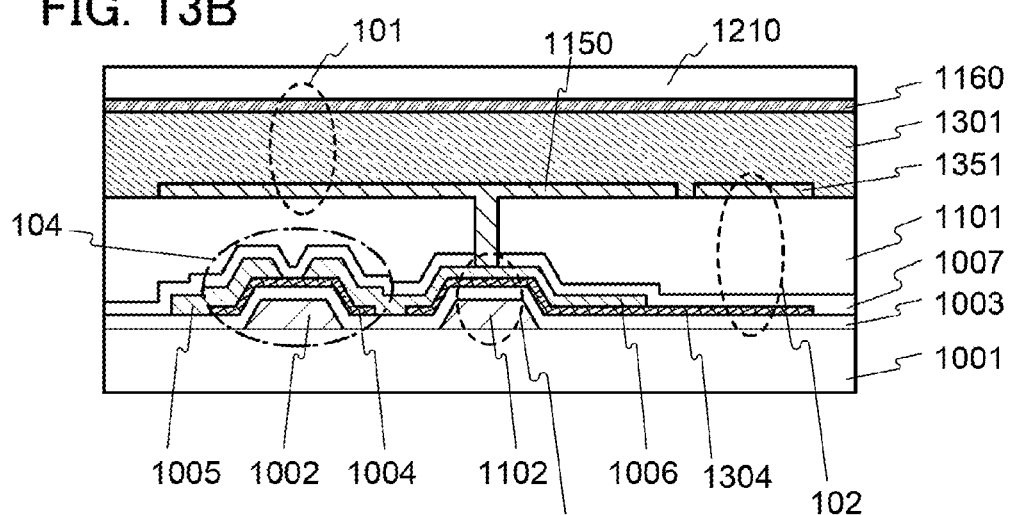
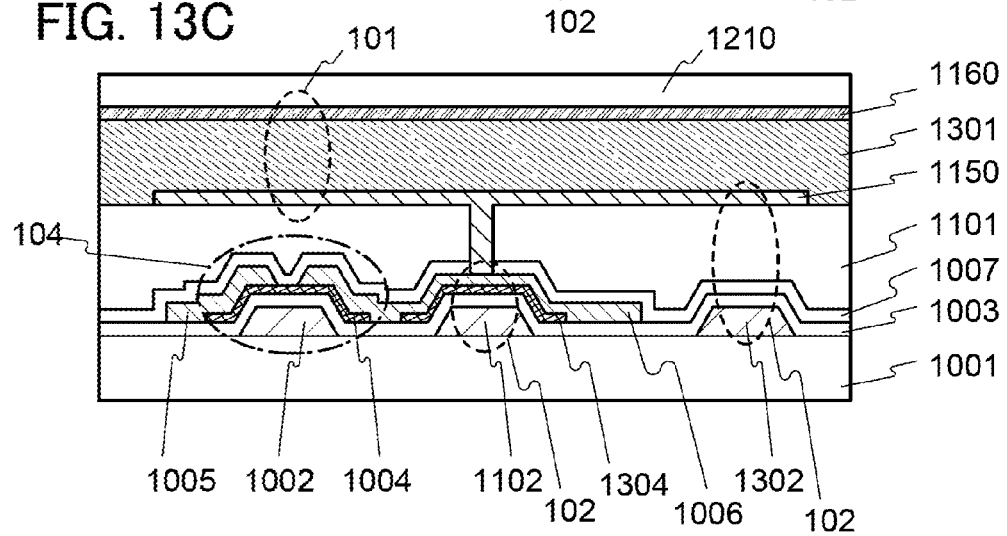

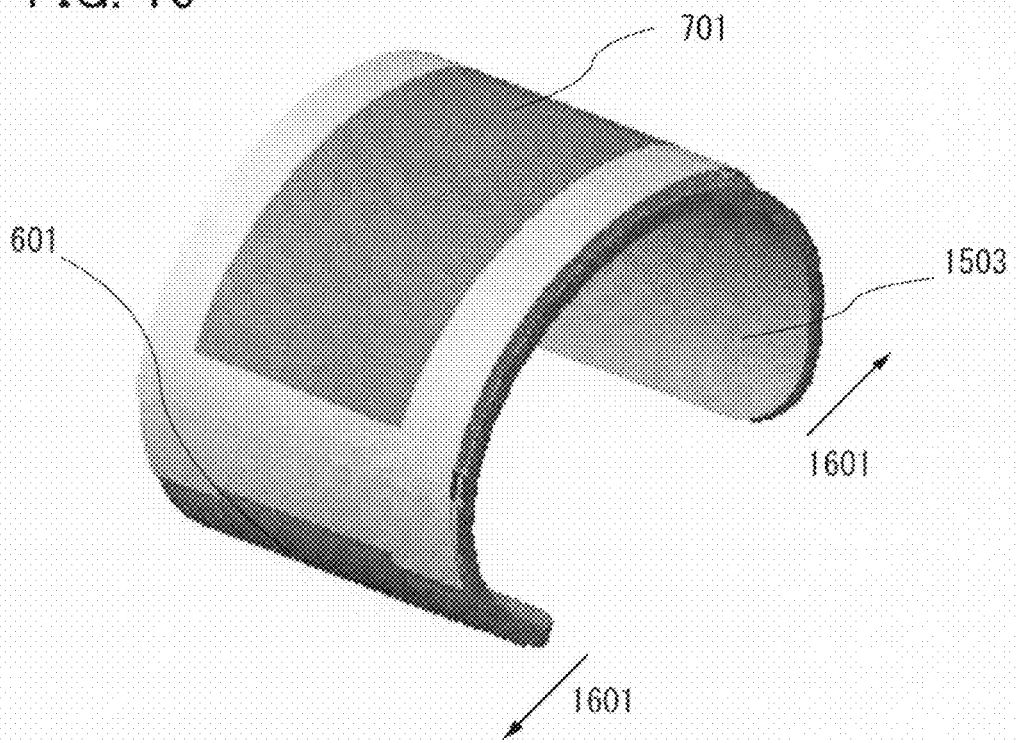

DISPLAY DEVICE

BACKGROUND OF THE INVENTION

1. Field of the Invention

One embodiment of the present invention relates to an object, a method, and a manufacturing method. In addition, one embodiment of the present invention relates to a process, a machine, manufacture, or a composition of matter. In particular, one embodiment of the present invention relates to, for example, a semiconductor device, a display device, a light-emitting device, a storage device, a driving method thereof, or a manufacturing method thereof. Furthermore, one embodiment of the present invention relates to, for example, a semiconductor device, a display device, or a light-emitting device each including an oxide semiconductor.

2. Description of the Related Art

Patent Document 1 discloses a semiconductor device provided with a transistor including an oxide semiconductor layer over a semiconductor substrate provided with a MOS transistor. Patent Document 2 discloses that a transistor including an oxide semiconductor film has extremely low leakage current in an off state.

REFERENCE

Patent Document

[Patent Document 1] Japanese Published Patent Application No. 2010-141230
[Patent Document 2] Japanese Published Patent Application No. 2012-257187

SUMMARY OF THE INVENTION

An object of one embodiment of the present invention is to provide a novel semiconductor device, a manufacturing method thereof, or a driving method thereof. Another object of one embodiment of the present invention is to provide a semiconductor device with excellent characteristics, a manufacturing method thereof, or a driving method thereof.

Another object of one embodiment of the present invention is to provide a novel driver circuit, a manufacturing method thereof, or a driving method thereof.

Another object of one embodiment of the present invention is to provide a semiconductor device which can store data even after the supply of power supply voltage (also referred to simply, power supply or driving voltage) is stopped, a manufacturing method thereof, or a driving method thereof.

Another object of one embodiment of the present invention is to provide a driver circuit which prevents data in a semiconductor device from being lost or a driving method thereof.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a display device including a capacitor that stores data, a display element that performs display in accordance with the data, and a switching element (also referred to as switch, simply) connected to electrodes of the capacitor. In the display device of one embodiment of the present invention, the voltage between the electrodes of the capacitor is held by turning the switching element off; thus, data can be stored even when the supply of power supply is stopped.

One embodiment of the present invention is a display device including a first switching element, a second switching element, a capacitor, and a display element. The first switching element is electrically connected to one electrode of the capacitor, the second switching element is electrically connected to the other electrode of the capacitor, the capacitor has a function of keeping a voltage corresponding to a video signal, and the display element has a function of performing display in accordance with the voltage. In a period during which the capacitor keeps the voltage, the first switching element and the second switching element are off and electrically disconnected with a driver circuit having a function of supplying a video signal.

The display device of one embodiment of the present invention uses a transistor including an oxide semiconductor as the switching element. The oxide semiconductor has a wider bandgap than silicon, for example; thus, the off-state current value of the transistor including the oxide semiconductor can be extremely low.

One embodiment of the present invention can be applied to not only the above display device but also devices without a display element.

In this specification, the semiconductor device refers to any device that can function by utilizing semiconductor characteristics. Thus, there is a case where a semiconductor element such as a transistor is referred to as a semiconductor device or a case where a device such as a display device including a semiconductor element is referred to as a semiconductor device.

According to one embodiment of the present invention, a novel semiconductor device can be provided. Furthermore, according to one embodiment of the present invention, it is possible to provide a semiconductor device which can store data even after the supply of power supply voltage is stopped.

Furthermore, according to one embodiment of the present invention, a driver circuit which prevents data in a semiconductor device from being lost or a driving method thereof can be provided.

BRIEF DESCRIPTION OF THE DRAWINGS

FIGS. 1A and 1B show an example of a semiconductor device or the like.

FIGS. 2A to 2C show an example of a semiconductor device or the like.

FIG. 3 shows an example of a semiconductor device or the like.

FIG. 4 shows an example of a semiconductor device or the like.

FIGS. 5A to 5C show an example of a driver circuit or the like.

FIGS. 6A to 6F show examples of redisplaying circuits or the like.

FIGS. 7A and 7B each show examples of a semiconductor device or the like.

FIGS. 8A to 8C each show an example of a semiconductor device or the like.

FIGS. 9A to 9C each show an example of a semiconductor device or the like.

FIGS. 10A and 10B each illustrate an example of a semiconductor device or the like.

FIGS. 11A and 11B illustrate an example of a semiconductor device or the like.

FIGS. 12A to 12C illustrate examples of semiconductor devices or the like.

FIGS. 13A to 13C each illustrate an example of a semiconductor device or the like.

FIG. 14 illustrates an example of a semiconductor device or the like.

FIGS. 15A to 15E illustrate examples of display devices or the like.

FIG. 16 illustrates an example of a display device or the like.

FIGS. 17A and 17B each illustrate an example of a display device or the like.

DETAILED DESCRIPTION OF THE INVENTION

Figure 1A:
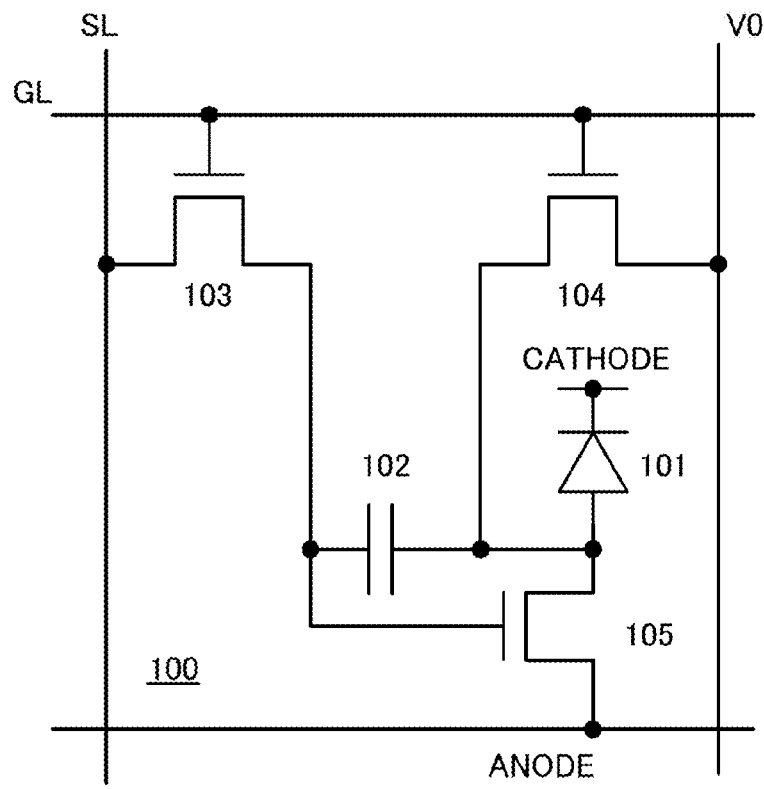

Embodiments and examples of the present invention will be described below with reference to the drawings. Note that one embodiment of the present invention is not limited to the following description. It will be readily appreciated by those skilled in the art that various changes and modifications are possible without departing from the spirit and the scope of the present invention. Therefore, one embodiment of the present invention should not be interpreted as being limited to the description of the embodiments to be given below. Note that in describing the structure of the present invention with reference to the drawing, reference numerals denoting the same portions are used in different drawings in common.

Note that "connection" in this specification means electrical connection and corresponds to the case where a circuit configuration is in the state in which current, voltage, or potential can be supplied or conducted. Accordingly, a connection state means not only a circuit configuration of direct connection but also a circuit configuration of electrical connection through a circuit element such as a wiring, a resistor, a diode, or a transistor so that current, voltage, or a potential can be supplied or transmitted.

Although the block diagram attached to this specification shows elements classified according to their functions in independent blocks, it might be practically difficult to completely separate the elements according to their functions, and one element might be involved in a plurality of functions.

Note that a "source" of a transistor means a source region that is part of a semiconductor film functioning as an active layer or a source electrode electrically connected to the semiconductor film. Similarly, a "drain" of a transistor means a drain region that is part of a semiconductor film functioning as an active layer or a drain electrode electrically connected to the semiconductor film. A "gate" means a gate electrode.

The terms "source" and "drain" of a transistor interchange with each other depending on the type of the channel of the transistor or levels of potentials applied to the terminals. In general, in an n-channel transistor, a terminal to which a lower potential is applied is called a source, and a terminal to which a higher potential is applied is called a drain. Further, in a p-channel transistor, a terminal to which a lower potential is applied is called a drain, and a terminal to which a higher potential is applied is called a source. In this specification, although connection relation of the transistor is described assuming that the source and the drain are fixed in some cases for convenience, actually, the names of the source and the drain interchange with each other depending on the relation of the potentials.

Note that what is described (or part thereof) in one embodiment can be applied to, combined with, or exchanged with another content (or part thereof) in the same embodiment and/or what is described (or part thereof) in another embodiment or other embodiments.

Note that the size, the thickness of layers, or regions in diagrams is sometimes exaggerated for simplicity. Therefore, embodiments of the present invention are not limited to such a scale.

Note that drawings are schematic views of ideal examples, and the embodiments of the present invention are not limited to the shape or the value illustrated in the drawings. For example, the following can be included: variation in shape due to a manufacturing technique or dimensional deviation; or variation in signal, voltage, or current due to noise or difference in timing.

A voltage usually refers to a potential difference between a given potential and a reference potential (e.g., a source potential or a ground potential (GND)). A voltage can be referred to as a potential and vice versa. Note that a potential (a voltage) is relative, and the potential of GND is not necessarily 0 V.

Even when the expression "electrically connect" is used in this specification, in an actual circuit, there is a case in which no physical connection is made and a wiring is just extended.

Note that the ordinal numbers such as "first" and "second" in this specification are used for the sake of convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

Note that a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Further, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "insulator" is not clear. Accordingly, a "semiconductor" in this specification can be called a "conductor" in some cases. Similarly, a "conductor" in this specification can be called a "semiconductor" in some cases.

Embodiment 1

In this embodiment, an example of a semiconductor device will be described. FIG. 1A shows an example of a circuit (also referred to as pixel or pixel circuit) included in the semiconductor device.

Figure 1B:
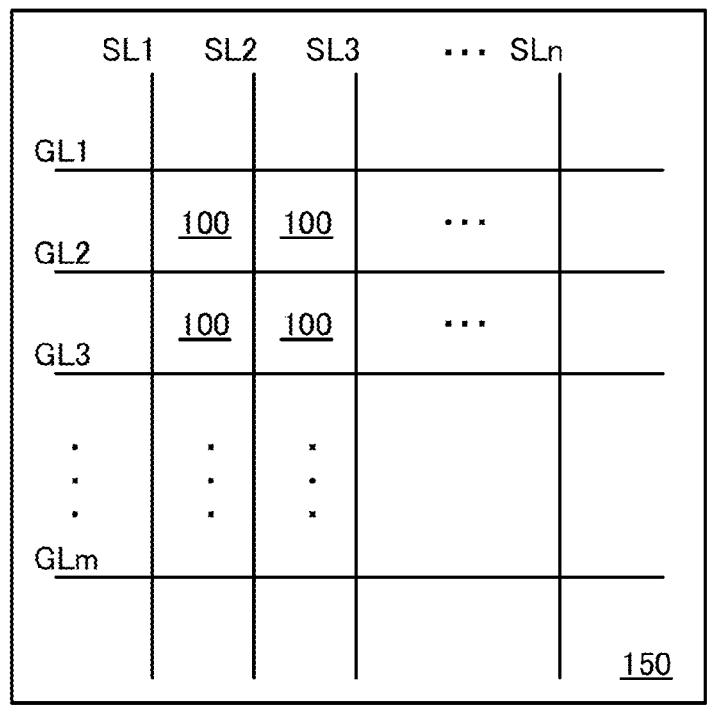

A circuit 100 in FIG. 1A includes a display element 101, a capacitor 102, a first transistor 103, a second transistor 104, and a third transistor 105. The semiconductor device functions as a display device and includes one or a plurality of circuits 100. As shown in FIG. 1B, the semiconductor device may include a circuit 150 in which the circuits 100 are arranged in matrix.

A gate of the first transistor 103 is electrically connected to a wiring GL (also referred to as gate line). One of a source and a drain of the first transistor 103 is electrically connected to a wiring SL (also referred to as source line). The other of the source and the drain of the first transistor 103 is electrically connected to one electrode of the capacitor 102 and a gate of the third transistor 105.

A gate of the second transistor 104 is electrically connected to the wiring GL. One of a source and a drain of the second transistor 104 is electrically connected to the other electrode of the capacitor 102, one electrode of the display element 101, and one of a source and a drain of the third transistor 105. The other of the source and the drain of the second transistor 104 is electrically connected to a wiring V0.

The other of the source and the drain of the third transistor 105 is electrically connected to a wiring ANODE.

The other electrode of the display element 101 is electrically connected to a wiring CATHODE.

Although the wiring ANODE, the wiring CATHODE, and the wiring V0 are not illustrated in the circuit 150 shown in FIG. 1B, they are arranged in each circuit 100 in a manner similar to that in FIG. 1A. Alternatively, the wirings may be shared with the plurality of circuits 100. For example, the wiring V0 may be shared between two circuits 100 adjacent to each other in the wiring GL direction. The wiring CATHODE may be shared between two circuits 100 adjacent to each other in the wiring SL direction.

The wiring GL has a function of supplying (inputting or transmitting) a potential that controls on/off (also referred to as conduction state/non-conduction state) of the first transistor 103 and a potential that controls on/off of the second transistor 104.

The wiring SL has a function of supplying a potential corresponding to a video signal (also referred to as data, signal, image signal, or the like).

The wiring V0 has a function of supplying a power supply potential to the other electrode of the capacitor 102. The wiring ANODE has a function of supplying a power supply potential to the one electrode (anode electrode in FIG. 1A) of the display element 101. The wiring CATHODE has a function of supplying a power supply potential to the other electrode (cathode electrode in FIG. 1A) of the display element 101.

The display element 101 is, for example, a light-emitting element such as an EL element and has a function of performing display in accordance with the amount of current flowing from the anode electrode to the cathode electrode.

The first transistor 103 has a function of supplying the potential of the wiring SL (the potential is also referred to as Vin) to the one electrode of the capacitor 102 and the gate of the third transistor 105.

The second transistor 104 has a function of supplying the potential of the wiring V0 (the potential is also referred to as V0) to the other electrode of the capacitor 102.

The capacitor 102 has a function of keeping the voltage (Vin−V0) corresponding to the potential difference between the wiring SL and the wiring V0. In other words, the capacitor 102 has a function of keeping the voltage corresponding to the video signal. In addition, the capacitor 102 has a function of keeping the voltage corresponding to the potential difference between the gate and one of the source and the drain of the third transistor 105. Note that the voltage corresponding to the video signal refers to the voltage (Vin−V0) corresponding to the potential difference between the potential Vin of the wiring SL and the potential V0 of the wiring V0.

The third transistor 105 has a function of adjusting the amount of current flowing in the display element 101 in accordance with the voltage held by the capacitor 102.

Thus, the display element 101 has a function of performing display in accordance with the voltage held by the capacitor 102.

Next, an operation of the circuit 100 shown in FIG. 1A will be described.

<Writing Operation>

The writing operation of a video signal is performed as follows. First, a potential at which both the first transistor 103 and the second transistor 104 are turned on is supplied to the wiring GL. When the first transistor 103 and the second transistor 104 are turned on, the one electrode of the capacitor 102 and the wiring SL are electrically connected, and the other electrode of the capacitor 102 and the wiring V0 are electrically connected. Then, the voltage corresponding to the potential difference between the potential of the wiring SL and the potential of the wiring V0 is applied between the electrodes of the capacitor 102. In other words, the voltage corresponding to a video signal is applied to the capacitor 102. In such a manner, the video signal is written to the circuit 100. Note that the wiring V0 can be regarded as a supplier of a potential at which the circuit 100 is initialized (initialization operation). In other words, in the circuit 100, the writing operation and the initialization operation can be concurrently performed.

Note that the initialization operation and the writing operation may be independently performed. In that case, the gate of the first transistor 103 and the gate of the second transistor 104 may be connected to respective wirings. The second transistor 104 is turned on, and the wiring V0 and the other electrode of the capacitor 102 are electrically connected, whereby initialization is performed. Then, the first transistor 103 is turned on, and the wiring SL and the one electrode of the capacitor 102 are electrically connected, whereby writing of the video signal can be performed.

In the case of writing operation, the potential of the wiring V0 is set to be higher than or equal to that of the wiring CATHODE, whereby current can be made to flow in the display element 101 during the writing operation. In contrast, the potential of the wiring V0 is set to be lower than or equal to that of the wiring CATHODE, whereby current can be prevented from flowing in the display element 101 during the writing operation. Furthermore, the potential of the wiring V0 and the potential of the wiring CATHODE are set to equal to each other, whereby the number of power supplies can be small. For example, the potential of the wiring V0 may be 0 V but not limited thereto.

<Storage Operation>

The storage operation of a video signal is performed as follows. The potential at which both the first transistor 103 and the second transistor 104 are turned off is supplied to the wiring GL. When the first transistor 103 and the second transistor 104 are turned off, the one electrode of the capacitor 102 is electrically disconnected to the wiring SL, and the other electrode of the capacitor 102 is electrically disconnected to the wiring V0. The voltage inputted during the writing operation is kept between the electrodes of the capacitor 102. In other words, the capacitor 102 stores the voltage corresponding to the video signal. While the voltage is held by the capacitor 102, the display element 101 can perform display corresponding to the held voltage.

<Display Operation>

The display operation is performed as follows. The current flows in the third transistor 105 in accordance with the voltage applied between the gate and the source. Specifically, the current flows when the voltage is higher than the threshold voltage of the third transistor 105. Then, in the direction from the wiring ANODE toward the wiring CATHODE, the current flows through the display element 101 that is electrically connected in series to the third transistor 105. Thus, the display element 101 can perform display in accordance with the amount of current. The voltage between the gate and the source of the third transistor 105 corresponds to the voltage held by the capacitor 102; thus, the display element 101 performs display in accordance with the voltage held by the capacitor 102.

As described above, in the circuit 100, the first transistor 103 is provided between the capacitor 102 and the wiring SL, and the second transistor 104 is provided between the capacitor 102 and the wiring V0. When the first transistor 103 and the second transistor 104 are turned off, a fluctuation or loss of the voltage held by the capacitor 102 can be suppressed as much as possible. As a result, the video signal written to the circuit 100 can be held.

Even in the case where the supply of potential to the wiring GL, the wiring SL, the wiring V0, the wiring ANODE, and the wiring CATHODE is stopped in the circuit 100, the capacitor 102 can hold the voltage. In other words, even in the case where the power supply is stopped, the capacitor 102 can hold the voltage. Thus, even in the case where the circuit 100 and a driver circuit (also referred to as driving device) used to write a video signal are electrically disconnected, the voltage can be held by the capacitor 102. The detachment of the driver circuit is possible; thus, a reduction in size of the semiconductor device or a reduction in cost can be achieved. Note that it is effective to electrically disconnect with the circuit 100 without detachment of the driver circuit.

<Redisplaying Operation>

In the case where display is performed again (redisplaying operation), the potential is supplied at least to the wiring ANODE and the wiring CATHODE, whereby display can be performed in accordance with the stored video signal. Thus, in the redisplaying operation, the number of power supplies can be smaller than that in the writing operation, and the power consumption can be reduced as compared with the case of writing operation. Moreover, a circuit used for the redisplaying operation can be reduced in size, power consumption, and the like as compared with the driver circuit.

Four periods of the writing operation, the storage operation, the display operation, and the redisplaying operation may be called a writing period, a storage period, a display period, and a redisplaying period, respectively.

Next, an example of a method for suppressing a fluctuation of the voltage held by the capacitor 102 in the circuit 100 is described.

First, in the circuit 100 as described above, the first transistor 103 is provided between the one electrode of the capacitor 102 and the wiring SL, and the second transistor 104 is provided between the other electrode of the capacitor 102 and the wiring V0.

It is preferable that the amount of current flowing in the first transistor 103 and the second transistor 104 that are off (the current is also referred to as off-state current or leakage current) be as small as possible.

As a method for reducing the off-state current, a transistor including an oxide semiconductor is used for the first transistor 103 and the second transistor 104. The oxide semiconductor has, for example, a wider band gap than silicon. Thus, a transistor including an oxide semiconductor can have extremely low off-state current.

For a material of the transistor, any of a variety of semiconductors such as a semiconductor containing a semiconductor belonging to Group 14 of the periodic table (e.g., silicon), an organic semiconductor, and a compound semiconductor can be used, besides the oxide semiconductor. Moreover, an amorphous semiconductor, a microcrystalline semiconductor, a polycrystalline semiconductor, a single crystal semiconductor, or the like can be used.

In addition, as another method for reducing the off-state current, the channel lengths of the first transistor 103 and the second transistor 104 may be made large. For example, at least in one of the first transistor 103 and the second transistor 104, the channel length may be larger than the channel width. Alternatively, at least in one of the first transistor 103 and the second transistor 104, the channel length may be larger than the channel length of the third transistor.

As another method for reducing the off-state current, the channel widths of the first transistor 103 and the second transistor 104 are made small. For example, at least in one of the first transistor 103 and the second transistor 104, the channel width may be smaller than the channel length. Alternatively, at least in one of the first transistor 103 and the second transistor 104, the channel width may be smaller than the channel width of the third transistor.

As another method for reducing the off-state current, the first transistor 103 and the second transistor 104 are formed to have a multi-gate structure. At least one of the first transistor 103 and the second transistor 104 may have a multi-gate structure.

Note that the transistors can have sizes different from those described above. For example, at least in one of the first transistor 103 and the second transistor 104, the channel length may be same as or larger than the channel width. Alternatively, at least in one of the first transistor 103 and the second transistor 104, the channel length may be smaller than the channel length of the third transistor 103. Alternatively, at least in one of the first transistor 103 and the second transistor 104, the channel width may be larger than the channel length. Alternatively, at least in one of the first transistor 103 and the second transistor 104, the channel width may be larger than the channel width of the third transistor. With such a structure, the switching speed of the transistor can be increased.

As another method for reducing the off-state current, the leakage current due to a gate insulating film of the transistor is reduced. When the gate insulating film contains a material with a high dielectric constant, the leakage current can be reduced. For example, the gate insulating film may contain hafnium oxide, zirconium oxide, lanthanum oxide, or the like. Besides, when the thickness of the gate insulating film is increased, the leakage current can be reduced. For example, the gate insulating film may have a region thicker than that of the gate electrode.

For the third transistor 105, any of a variety of semiconductors such as a semiconductor containing a semiconductor belonging to Group 14 of the periodic table (e.g., silicon), an organic semiconductor, a compound semiconductor, and an oxide semiconductor can be used. Moreover, an amorphous semiconductor, a microcrystalline semiconductor, a polycrystalline semiconductor, a single crystal semiconductor, or the like can be used. In particular, a transistor including an oxide semiconductor is preferably used because it has better electrical characteristics such as field-effect mobility or reliability than a transistor including amorphous silicon, for example. Moreover, an oxide semiconductor is preferably used for all of the first transistor 103, the second transistor 104, and the third transistor 105 because the transistors can be formed through one process.

Figure 2A:
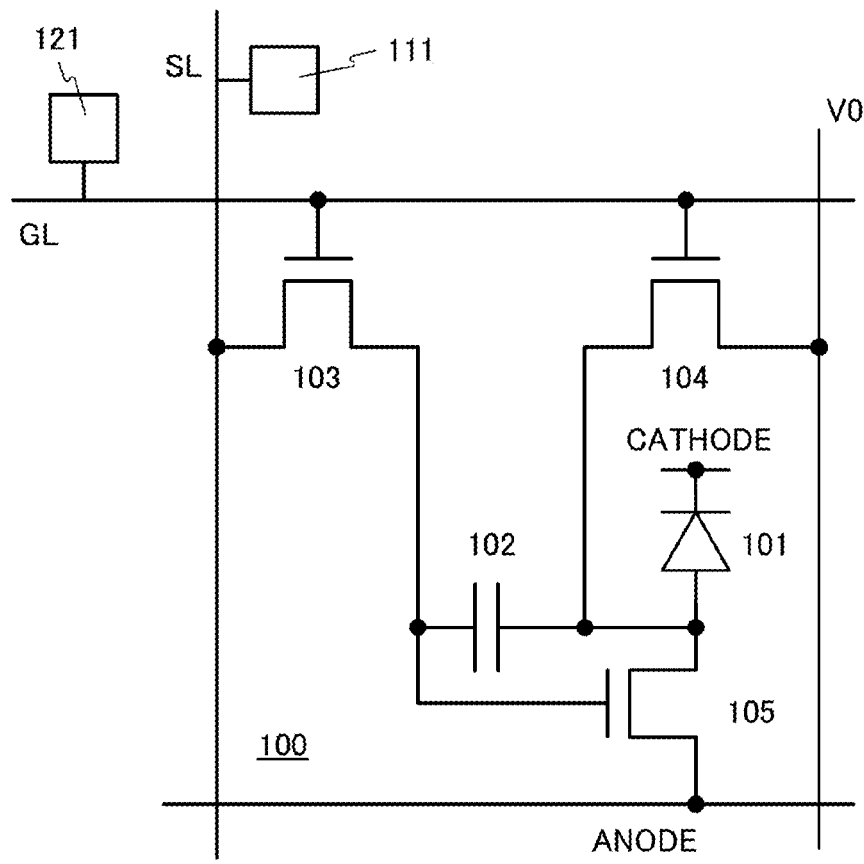

FIG. 2A shows another embodiment of the semiconductor device. In the semiconductor device in FIG. 2A, the wiring SL may be electrically connected to a protective circuit 111. The wiring GL may be electrically connected to a protective circuit 121.

Figure 2B:
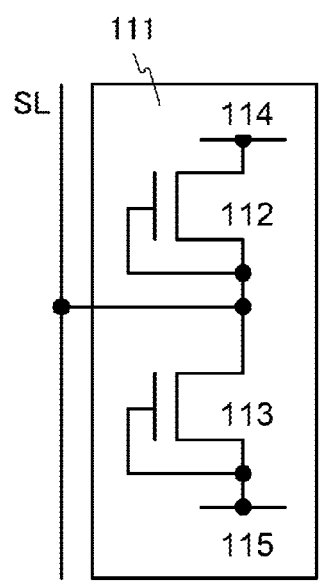

FIG. 2B shows an example of the protective circuit 111 electrically connected to the wiring SL. The wiring SL is electrically connected to a wiring 114 through the transistor 112 that is diode-connected. In addition, the wiring SL is electrically connected to a wiring 115 through the transistor 113 that is diode-connected. The high power supply potential is supplied to the wiring 114, and the low power supply potential is supplied to the wiring 115.

Figure 2C:
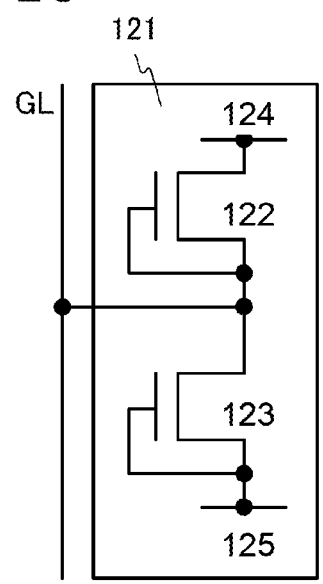

FIG. 2C shows an example of the protective circuit 121 electrically connected to the wiring GL. The wiring GL is electrically connected to a wiring 124 through a transistor 122 that is diode-connected. In addition, the wiring GL is electrically connected to a wiring 125 through a transistor 123 that is diode-connected. The high power supply potential is supplied to the wiring 124, and the low power supply potential is supplied to the wiring 125.

For each of the transistors 112, 113, 122, and 123, any of a variety of semiconductors such as a semiconductor containing a semiconductor belonging to Group 14 of the periodic table (e.g., silicon), an organic semiconductor, a compound semiconductor, and an oxide semiconductor can be used. Moreover, an amorphous semiconductor, a microcrystalline semiconductor, a polycrystalline semiconductor, a single crystal semiconductor, or the like can be used.

Figure 3:
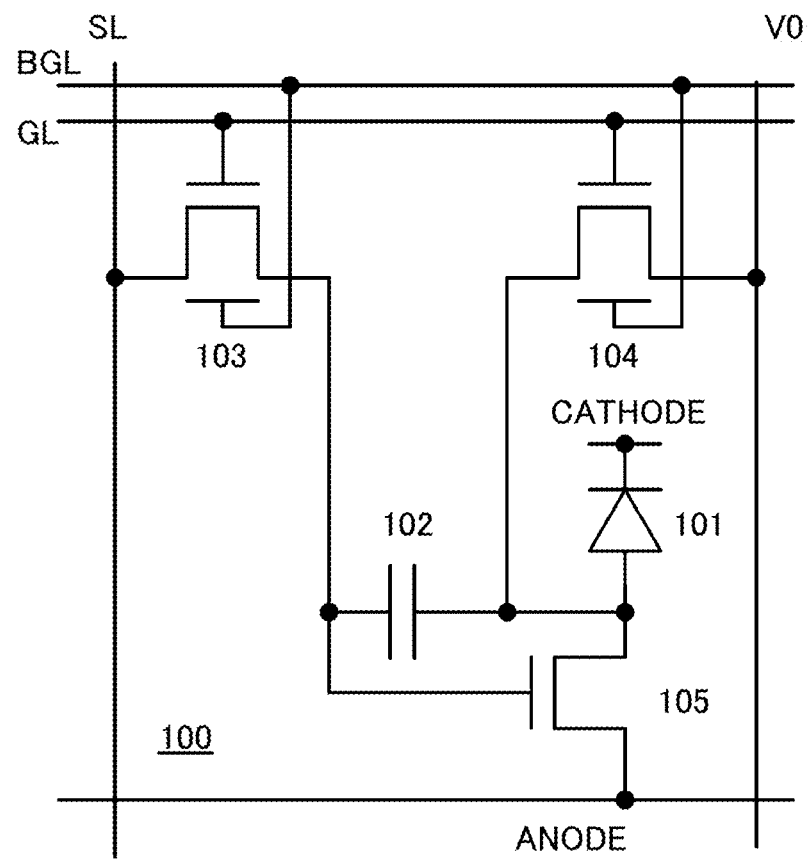

FIG. 3 shows another embodiment of a semiconductor device. In the semiconductor device in FIG. 3, each of the first transistor 103 and the second transistor 104 has a back gate (also referred to as second gate). The back gate of the first transistor 103 is electrically connected to a wiring BGL. The back gate of the second transistor 104 is electrically connected to the wiring BGL. The wiring BGL has a function of adjusting the threshold voltages of the first transistor 103 and the second transistor 104. Thus, even in the case where the first transistor 103 and the second transistor 104 are normally-on transistors, on/off of the transistor can be controlled by supplying the potential from the wiring BGL. Note that each back gate may be electrically connected to the wiring GL without the wiring BGL.

In the semiconductor device in FIG. 3, the back gate of the first transistor 103 and the back gate of the second transistor 104 may be electrically connected to respective wirings different from each other. The third transistor 105 may also have a back gate. The gate and the back gate of the third transistor 105 are electrically connected, whereby the current supply capability of the third transistor 105 can be improved. The gate and the back gate of the third transistor 105 are electrically connected to respective wirings different from each other, whereby the back gate has a function of adjusting the threshold voltage.

When at least one of the above methods is used, the off-state current can be reduced. Furthermore, when any of the above methods are used in combination, the methods are synergistically affected, and the off-state current can be further reduced.

<Stopping Operation>

Next, an operation where the driving of the circuit 100 is stopped in a period during which a video signal is stored by the circuit 100 (the operation is also referred to as stopping operation) is described. Here, the operation of stopping the driving is referred to as the operation where the supply of potential to each wiring of the circuit 100 is stopped.

First, the initial state of the storage period is set to such a state that both the first transistor 103 and the second transistor 104 are off and the display element 101 performs display. Note that the storage operation may be regarded as part of the stopping operation. In that case, as an operation (0), the potential at which both the first transistor 103 and the second transistor 104 are turned off is supplied to the wiring GL, whereby the initial state is made. The potential at which the transistors are turned off is set to the same potential as that of the wiring CATHODE, whereby the number of power supplies in the redisplaying operation can be reduced. The same potential indicates not only the potential that is completely the same but also the potential that is substantially the same in consideration of a slight error in design.

Next, as an operation (1), the potential of the wiring SL and the potential of the wiring V0 are set to the same potential as that of the wiring GL. By the operation (1), the number of power supplies in the redisplaying operation can be reduced. Alternatively, the operation (0) and the operation (1) may be performed concurrently, so that the wiring GL, the wiring SL, and the wiring V0 are set to have the same potential at the same time. When the operation (0) and the operation (1) are separately performed, a fluctuation or loss of voltage at the capacitor 102 can be suppressed. Furthermore, after the potential of the wiring SL is set to the same potential as the wiring GL, the potential of the wiring V0 may be set to the same potential as the wiring GL. Alternatively, the setting of potentials may be changed in the reverse order. Note that the operation (1) may be skipped.

Next, as an operation (2), the potential of the wiring ANODE is set to the same potential of the wiring CATHODE. Thus, the displayed image on the display element 101 disappears. By this operation (2), a rapid reduction of potential at the time of stopping supplying the potential in a subsequent operation (operation (3)) can be prevented, so that a fluctuation or loss of voltage of the capacitor 102 can be suppressed as much as possible. It is possible to perform the operation (1) and the operation (2) concurrently; however, when the operations are performed separately, a fluctuation or loss of voltage of the capacitor 102 can be further suppressed. It is possible to reverse the order of the operation (1) and the operation (2); however, when the operation (2) is performed after the operation (1), a fluctuation or loss of voltage of the capacitor 102 can be further suppressed. Note that when there is no problem of a rapid reduction of potential, the operation (2) may be skipped.

Lastly, as the operation (3), the supply of potential to each wiring of the circuit 100 is stopped, and the driving of the circuit 100 is stopped. Specifically, the circuit 100 and the driver circuit used for writing the video signal are electrically disconnected. Even when the driver circuit is stopped, the voltage at the capacitor 102 can be held. Thus, the driver circuit can be detached, and the semiconductor device including the circuit 100 but not including the driver circuit can be used. When the driver circuit is detached and the driver circuit and the semiconductor device are separated, the size and weight of the semiconductor device can be reduced, and the durability thereof can be improved, for example.

Note that with the circuit configuration of the circuit 100, the voltage at the capacitor 102 can be held; thus, the driving of the circuit 100 in an initial state can be stopped without the stopping operation. In contrast, when the stopping operation is performed, the number of power supplies used in the redisplaying operation can be reduced, or a fluctuation or loss of the voltage during the storage period can be suppressed. Thus, it is extremely effective to perform the stopping operation in the circuit configuration in the circuit 100.

When the stored video signal is erased and writing data is performed again, the writing operation is performed again.

Furthermore, when the circuits 100 are arranged in matrix as shown in FIG. 1B, a plurality of images can be stored. For example, a first video signal is stored in a plurality of circuits 100 electrically connected to wirings GL1 to $GL_m$ (m is an integer greater than or equal to 1) in odd-numbered rows (m=1, 3, 5, 7, or the like), and a second video signal is stored in a plurality of circuits electrically connected to the wirings GL2 to $GL_m$ in even-numbered rows (m=2, 4, 6, 8, or the like). During the redisplaying period, the circuits 100 in the odd-numbered rows and the circuits 100 in the even-numbered rows are switched to be driven, whereby a plurality of images can be displayed. Specifically, during a first period in the redisplaying period, the potential may be supplied to the wirings ANODE and CATHODE of the circuits 100 in the odd-numbered rows, and during a second period in the redisplaying period, the potential may be supplied to the wirings ANODE and CATHODE of the circuits 100 in the even-numbered rows. A selection circuit may be provided to switch supplying the potential to the circuits 100 in the odd-number rows and the even-number rows. In addition, three or more images can be stored in a manner similar to the above.

Although in this embodiment, the circuit shown in FIGS. 1A and 1B, FIGS. 2A to 2C, or FIG. 3 is given as an example, another circuit can be used.

Part or the whole of this embodiment can be freely combined with part or the whole of another embodiment.

Embodiment 2

In this embodiment, another example of the stopping operation is described. The example described here is to increase the data storage capability in the stopping operation of the circuit 100 shown in FIGS. 1A and 1B as compared with the case of Embodiment 1.

In Embodiment 1, the potential at which the first transistor 103 and the second transistor 104 are turned off is supplied to the wiring GL in the stopping operation. For example, at a potential of 0 V, the transistors can be turned off.

However, in the case where the first transistor 103 and the second transistor 104 are normally-off transistors, the transistors are not off even at a potential of 0 V supplied to the wiring GL, and current may flow.

Thus, in this embodiment, the potential supplied to the wiring SL or the wiring V0 is set to higher in the operation (1) of the stopping operation. With the high potential, flowing current can be suppressed even in the case where the first transistor 103 or the second transistor 104 is a normally-off transistor. As a result, a loss of video signal in the circuit 100 can be suppressed. In the redisplaying operation of the circuit 100, the wiring SL or the wiring V0 is set to have the high potential, whereby redisplaying images can be performed in accordance with the stored video signal.

For example, the potential of the wiring SL or the wiring V0 may be set to higher than that of the wiring GL. In particular, the potential of the wiring SL or the wiring V0 is set to have the same potential as the wiring ANODE, whereby the number of power supplies can be reduced. Note that it is not necessary to set the potential of the wiring SL or the wiring V0 to the same as the wiring ANODE.

Alternatively, both the wiring SL and the wiring V0 may have the high potential. In that case, the potential of the wiring SL is set to the same as that of the wiring V0, whereby the number of power supplies can be reduced. Note that it is possible to set the potential of the wiring SL and the potential of the wiring V0 to be different from each other. For example, in the case where current flows more easily through the first transistor 103 than through the second transistor 104, the potential of the wiring SL is set to higher than that of the wiring V0, whereby current can be made to be less likely to flow through the first transistor 103. Alternatively, the potential of the wiring SL may be set to lower than that of the wiring V0.

Note that in the case where the wiring SL is electrically connected to the protective circuit 111 as shown in the semiconductor device in FIGS. 2A and 2B, the high potential that is supplied to the wiring SL can be supplied from the wiring 114 or the wiring 115. With this structure, the power supply potential supplied to the protective circuit 111 in the stopping operation can be used as the high potential that is supplied to the wiring SL.

Although the circuit 100 shown in FIGS. 1A and 1B or FIGS. 2A to 2C is described as an example in this embodiment, another circuit can be employed.

Part or the whole of this embodiment can be freely combined with part or the whole of another embodiment.

Embodiment 3

In this embodiment, another example of the stopping operation will be described. As described above, when the first transistor 103 or the second transistor 104 is a normally-on transistor, current flows during the stopping period.

Thus, in this embodiment, the potential of the wiring GL is set low in the operation (0) of the stopping operation. Even when the first transistor 103 or the second transistor 104 is a normally-on transistor, the low potential enables the flow of current to be suppressed. For example, the potential of the wiring GL is preferably lower than 0 V. As a result, a loss of video signal of the circuit 100 can be suppressed. In the redisplaying operation of the circuit 100, the potential of the wiring GL is set low, whereby redisplaying images can be performed in accordance with the stored video signal.

Note that in the case where the first transistor 103 or the second transistor 104 is an n-channel transistor, the potential of the wiring GL is set low as described above, and in the case where the first transistor 103 or the second transistor 104 is a p-channel transistor, the potential of the wiring GL may be set high.

In the case where the wiring GL is electrically connected to the protective circuit 121 as shown in the semiconductor device in FIGS. 2A and 2C, the low potential that is supplied to the wiring GL can be supplied from the wiring 124 or the wiring 125. With this structure, the power supply potential supplied to the protective circuit 121 in the stopping operation can be used as the low potential that is supplied to the wiring GL.

Although the circuit 100 shown in FIGS. 1A and 1B or FIGS. 2A to 2C is given as an example in this embodiment, another circuit can be employed.

Part or the whole of this embodiment can be freely combined with part or the whole of another embodiment.

Embodiment 4

Figure 4:
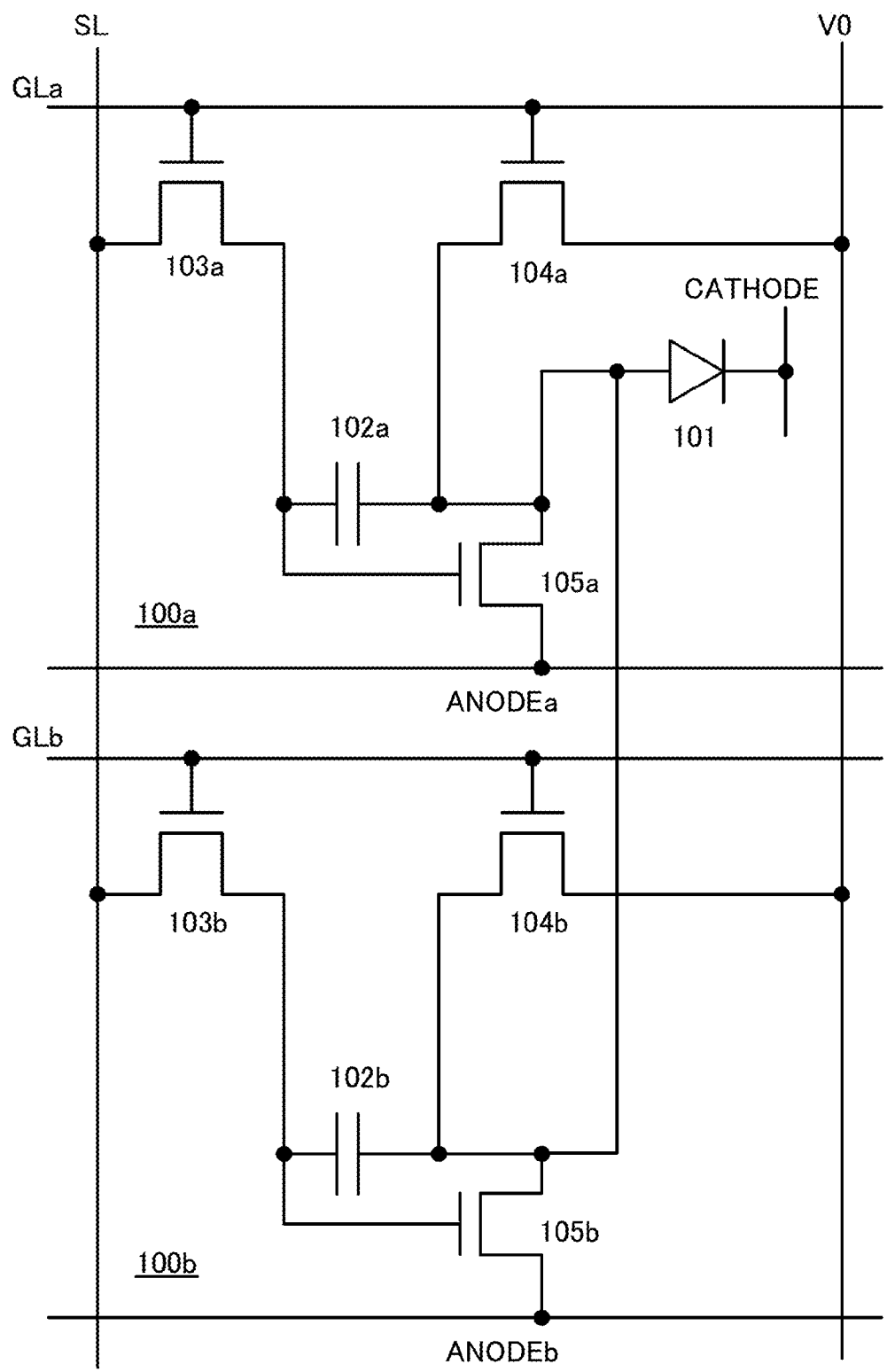

In this embodiment, an example of a semiconductor device will be described. FIG. 4 shows an example of a circuit included in the semiconductor device.

A circuit 100a and a circuit 100b in FIG. 4 each have a connection relation similar to that of the circuit 100 in FIG. 1A. In the configuration of FIG. 4, the display element 101 is shared between the circuit 100a and the circuit 100b, which is different from the configuration of FIG. 1A. In other words, one electrode of the display element 101 is electrically connected to a wiring ANODEa through a third transistor 105a of the circuit 100a and also electrically connected to a wiring ANODEb through a fourth transistor 105b of the circuit 100b.

With use of the semiconductor device in FIG. 4, the following effect can be obtained.

In the case of the circuit 100 in FIGS. 1A and 1B, burn-in may be caused in a pixel due to the storage of one video signal for a long time.

In the semiconductor device shown in FIG. 4, a video signal that is to be displayed is written to the circuit 100a, and an inverted signal of the video signal is written to the circuit 100*b*. Then, the display element 101 is made to display an image in accordance with the video signal of the circuit 100*a*, and after a predetermined period, the display element 101 is made to display an image in accordance with the inverted signal of the circuit 100*b*. Every predetermined period, the video signal and the inverted signal are switched, whereby burn-in can be suppressed.

The wiring ANODEa and the wiring ANODEb are switched so that the potential is supplied to the wiring ANODEa during a period where the display is performed by the video signal and the potential is supplied to the wiring ANODEb during a period where the display is performed by the inverted signal. For example, a selection circuit may be provided to switch a conduction state between the wiring ANODEa and the wiring ANODEb in the semiconductor device. Alternatively, a switching element may be provided between the wiring ANODEb and the third transistor 105*b* to turn the switching element on in the case where the display is performed by the inverted signal. The switching element may be provided between the display element 101 and the third transistor 105*b* or between the third transistors 105*b* of pixels that are adjacent to each other in the wiring GL direction.

Furthermore, the circuit 100*b* may store a signal based on a monochroic image or a single gray scale image such as a black image, which is effective in suppressing burn-in as in the case of writing an inverted signal.

Although the circuit shown in FIG. 4 is described as an example in this embodiment, another circuit can be employed.

Part or the whole of this embodiment can be freely combined with part or the whole of another embodiment.

Embodiment 5

In this embodiment, an example of a driver circuit will be described. A circuit shown in a driver circuit 501 in FIG. 5A has a function of driving the circuit 100 in FIGS. 1A and 1B.

The driver circuit 501 includes a first circuit 502 (also referred to as gate driver) and a second circuit 503 (also referred to as source driver). In addition, the driver circuit 501 may include a CPU, a memory, or the like.

The first circuit 502 has a function of supplying the potential to the wiring GL1 to the wiring $GL_m$. For example, any of the wiring GL1 to the wiring $GL_m$ is electrically connected to the wiring GL shown in FIG. 1A or the like. In addition, the first circuit 502 has a function of supplying the potential to gates of the first transistor 103 and the second transistor 104. Moreover, the first circuit 502 may have a function of supplying the potential to the wiring 124 or the wiring 125 in FIGS. 2A to 2C or the wiring BGL in FIG. 3.

The second circuit 503 has a function of supplying the potential to the wiring SL1 to the wiring $SL_n$ (n is an integer greater than or equal to 1). For example, any of the wiring SL1 to the wiring $SL_n$ is electrically connected to the wiring SL shown in FIG. 1A or the like. In addition, the second circuit 503 has a function of supplying the potential to one electrode of the capacitor 102 through the first transistor 103.

Figure 5A:
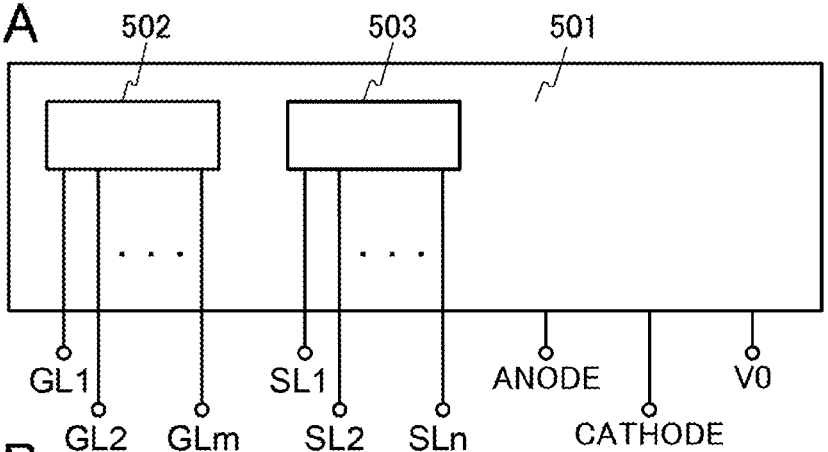
Figure 5B:
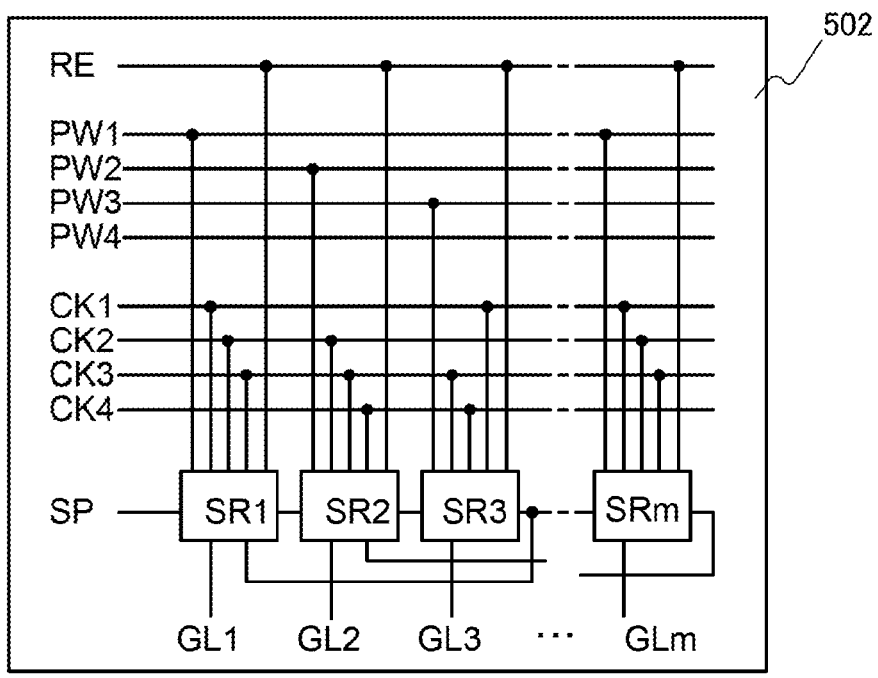
Figure 5C:
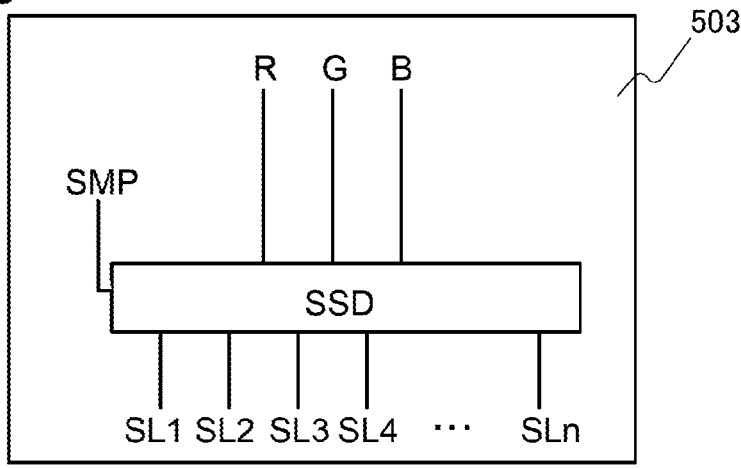

In the case where m and n are each greater than or equal to 2, the wiring GL1 to the wiring $GL_m$ and the wiring SL1 to the wiring $SL_n$ in FIGS. 5A to 5C correspond to the wiring GL1 to the wiring $GL_m$ and the wiring SL1 to the wiring $SL_n$ of the circuit 150 in FIG. 1B.

The driver circuit 501 is electrically connected to the wiring ANODE shown in FIG. 1A or the like and has a function of supplying the potential to the wiring ANODE. In addition, the driver circuit 501 is electrically connected to the wiring CATHODE shown in FIG. 1A or the like and has a function of supplying the potential to the wiring CATHODE. Furthermore, the driver circuit 501 is electrically connected to the wiring V0 shown in FIG. 1A and has a function of supplying the potential to the wiring V0. Moreover, the driver circuit 501 may have a function of supplying the potential to the wiring ANODEa and the wiring ANODEb in FIG. 4.

As described above, the driver circuit 501 has a function of supplying the potential to each wiring of the circuit 100 shown in FIG. 1A or the like to write a video signal, a function of storing the video signal, and a function of making image display in accordance with the video signal.

Furthermore, the driver circuit 501 has a function of performing the stopping operation described in the above embodiment. When the driver circuit 501 performs the stopping operation, a loss of the video signal during the storage period of the circuit 100 can be suppressed as much as possible, for example.

In addition, the stopping operation is performed when the circuit 100 and the driver circuit 501 are electrically disconnected regardless of the storage period of the video signal, whereby a rapid reduction of voltage in the circuit 100 can be suppressed.

Although in this embodiment, an example in which the driver circuit 501 makes the circuit 100 to stop is described, the driver circuit 501 can be used for another circuit. The driver circuit 501 enables a circuit other than the circuit having a storage function or the like to be driven. For example, before the driver circuit 501 and a circuit without a storage function are electrically disconnected, the stopping operation is performed, whereby a rapid reduction of voltage can be suppressed.

FIG. 5B shows an example of the first circuit 502. The first circuit 502 includes shift registers SR1 to $SR_m$. To the shift registers, a signal RE, signals PW1 to PW4, signals CK1 to CK4, and a signal SP are inputted. The signal RE is a reset signal, the signals PW1 to PW4 are pulse width control signals, the signals CK1 to CK4 are clock signals, and the signal SP is a start pulse signal. With each signal, the wiring GL1 to wiring $CL_m$ are controlled. The first circuit 502 is not limited to the circuit shown in FIG. 5B.

FIG. 5C shows an example of the second circuit 503. The second circuit 503 includes a selection circuit SSD. To the selection circuit SSD, a signal R, a signal G, a signal B, and a signal SMP are supplied. The signal R is a video signal used for displaying red gradation image, the signal G is a video signal used for displaying green gradation image, the signal B is a video signal used for displaying blue gradation image, and the signal SMP is a sampling signal. Each voltage value of the video signals is adjusted depending on the gray scale level to be displayed. The selection circuit SSD is driven by time division with use of a video signal shared between a plurality of wirings. In the selection circuit SSD, video signals are supplied in series to three wirings SL that are regarded as one wiring; for example, the signal R is supplied to the wiring SL1, the signal G is supplied to the wiring SL2, and the signal B is supplied to the wiring SL3. In other words, the wirings SL are driven by time division. To the wiring SL4, the signal R is supplied. With each signal, driving of the wirings SL1 to $SL_n$ is controlled. The second circuit 503 is not limited to the circuit shown in FIG. 5C.

Part or the whole of this embodiment can be freely combined with part or the whole of another embodiment.

Embodiment 6

In this embodiment, an example of a circuit performing the redisplaying operation will be described. The redisplaying operation is such an operation that the circuit 100 shown in FIGS. 1A and 1B and the driver circuit 501 shown in FIG. 5A are electrically disconnected and then an image is redisplayed on the display element 101. FIGS. 6A to 6F show examples of circuits performing the redisplaying operation (the circuit is also referred to as redisplaying circuit or power supply circuit).

Figure 6A:
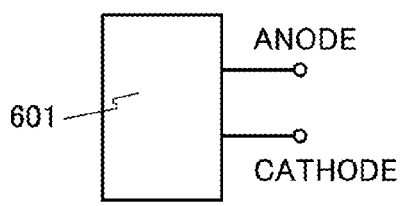

A redisplaying circuit 601 shown in FIG. 6A is an example of a circuit having two power supplies. For example, in the circuit 100, the potential can be supplied to the wiring ANODE and the wiring CATHODE.

Figure 6B:
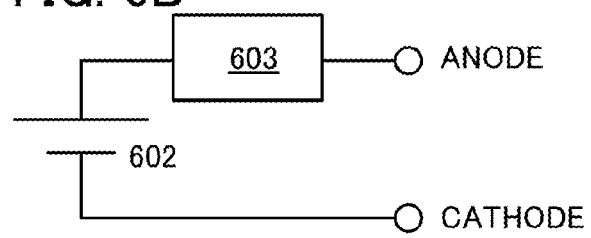

FIG. 6B shows an example of the redisplaying circuit 601. The redisplaying circuit 601 includes a power supply 602 and a converting circuit (also referred to as converter) 603. As the converter 603, a DCDC converting circuit (also referred to as DCDC converter) or the like can be used.

As the power supply 602, a power storage device such as a lithium ion battery is used for example. Another power storage device such as a nickel-metal hydride battery, a nickel-cadmium battery, or a lithium ion capacitor may be used. Note that it is preferable to use a secondary battery that can perform charge/discharge. A primary battery may be used.

In the case where the power supply 602 can be charged, wireless charging may be performed. In such a case, the redisplaying circuit 601 includes an antenna for wireless charging or the like.

The converter 603 has a function of converting the potential of the power supply 602 to a desired potential and supplying the desired potential to the wiring ANODE. Note that a configuration without the converter 603 may be employed.

Figure 6C:
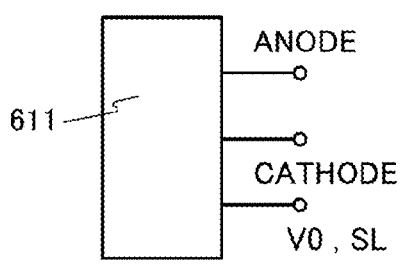
Figure 6D:
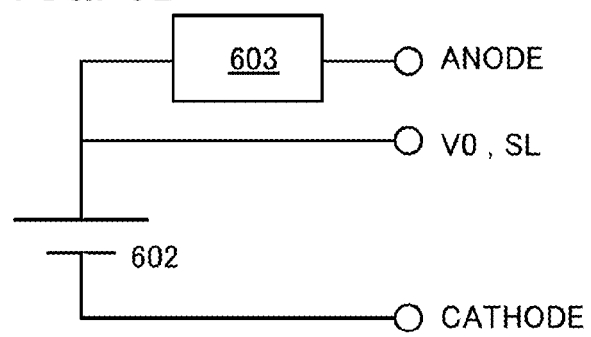

A redisplaying circuit 611 shown in FIG. 6C is an example of a circuit having three power supplies. For example, in the circuit 100, the potential can be supplied to the wiring ANODE, the wiring CATHODE, the wiring V0, and the wiring SL. The redisplaying circuit 611 can be employed when the potential is supplied to the wiring V0 and the wiring SL as described in Embodiment 2. In the case where the wiring V0 and the wiring SL are supplied with different potentials from each other, the number of converters 603 may be increased, and the number of output terminals may be increased. In the case where the wiring V0 and the wiring SL are supplied with the same potential as that of the wiring ANODE or the wiring CATHODE, the redisplaying circuit 601 shown in FIG. 6A may be employed. FIG. 6D shows an example of the redisplaying circuit 611, which includes another power supply for supplying the potential to the wiring V0 and the wiring SL, in addition to the configuration in FIG. 6B (i.e., the circuit in FIG. 6D includes three power supplies). As for the power supply for supplying the potential to the wiring V0 and the wiring SL, the potential of the power supply 602 can be used.

As described above, the number of converters 603 and the number of output terminals are changed in accordance with the number of needed power supplies. Thus, the redisplaying circuit 611 can be applied to the case where the potential is supplied to the wiring GL as described in Embodiment 3.

Figure 6E:
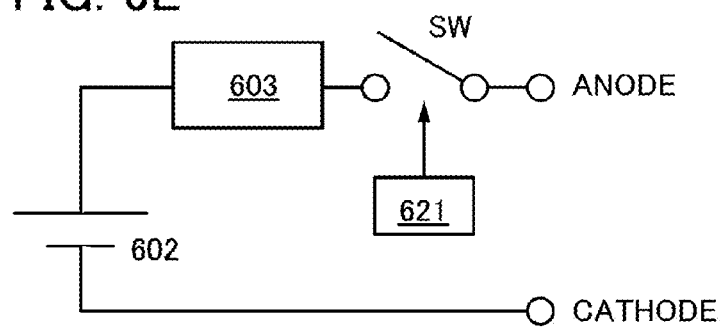

FIG. 6E is a modified example of FIG. 6B. A switching element SW is provided between the power supply 602 and the wiring ANODE. In addition, a timer 621 that controls the timing of on/off of the switching element SW is provided. With the switching element SW and the timer 621, conduction between the power supply 602 and the wiring ANODE can be controlled. With this configuration, a blinking display can be performed in the redisplaying operation. Note that the switching element SW may be provided between the power supply 602 and the wiring CATHODE, and the switching element SW is preferably provided between the redisplaying circuit and the circuit 100 or the like. In addition, the switching element SW and the timer 621 may be employed for a configuration in FIG. 6D.

Figure 6F:
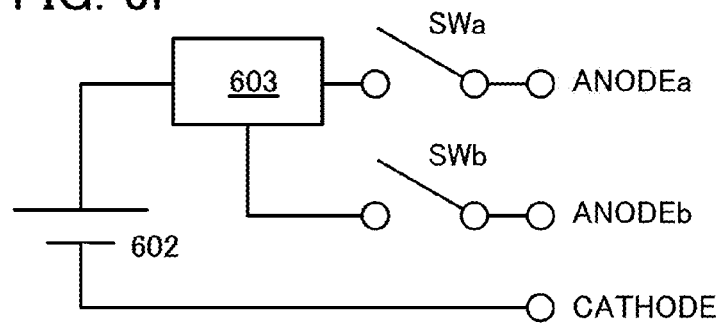

FIG. 6F shows an example of a circuit performing the redisplaying operation in the circuit 100a and the circuit 100b shown in FIG. 4. In the case where display is performed by a video signal, a switching element SWa is turned on and a switching element SWb is turned off, whereby the conduction between the power supply 602 and the wiring ANODEa is made. In the case where display is performed by an inverted signal, the switching element SWb is turned on and the switching element SWa is turned off, whereby the conduction between the power supply 602 and the wiring ANODEb is made. With such a switching circuit including the switching element SWa and the switching element SWb, a video signal and an inverted signal can be switched every predetermined period. In addition, the redisplaying circuit shown in FIG. 6F may be connected to the semiconductor device storing a plurality of images described in Embodiment 1. In such a case, the wiring ANODEa can be electrically connected to the wirings ANODE in odd-numbered rows, and the wiring ANODEb can be electrically connected to the wirings ANODE in even-numbered rows.

With use of the redisplaying circuit described in this embodiment, display can be performed even when the driver circuit is detached from the semiconductor device. Thus, this embodiment is extremely effective for a semiconductor device in which a driver circuit cannot be mounted. As an example of a semiconductor device in which a driver circuit cannot be mounted, a small-sized semiconductor device, a lightweight semiconductor device, a semiconductor device in which the number of power supplies is restricted, or the like can be given.

In the case where the driver circuit 501 is not detached, the potential is supplied from the driver circuit 501 to the wiring ANODE, the wiring CATHODE, the wiring V0, and the wiring SL; thus, it is not necessary to use the redisplaying circuit.

Part or the whole of this embodiment can be freely combined with part or the whole of another embodiment.

Embodiment 7

In this embodiment, an example of a case where a circuit connected to a semiconductor device is switched between a driver circuit and a redisplaying circuit will be described.

Figure 7A:
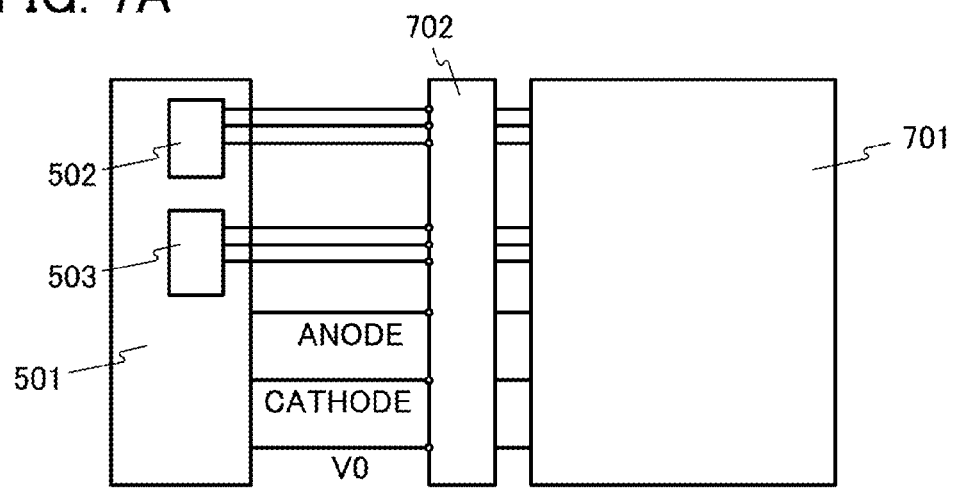

FIG. 7A shows a state where the driver circuit 501 is connected to a semiconductor device 701. The semiconductor device 701 includes the circuit 100 or the circuit 150 shown in FIGS. 1A and 1B, FIGS. 2A to 2C, FIG. 3, and FIG. 4. The semiconductor device 701 and the driver circuit 501 are connected through a connection portion 702. In this state, the writing operation, the storage operation, the display operation, and the stopping operation can be performed. The connection portion 702 can includes an FPC or the like.

Figure 7B:
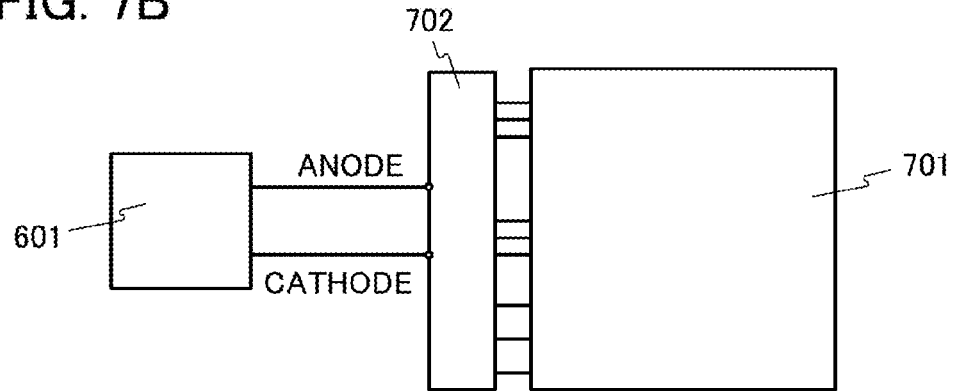

FIG. 7B shows a state where the redisplaying circuit 601 is connected to the semiconductor device 701. The semiconductor device 701 and the redisplaying circuit 601 are connected through the connection portion 702. In this state, the redisplaying operation can be performed. Note that instead of the redisplaying circuit 601, another circuit that is any of the circuits shown in FIGS. 6C to 6F may be used.

As described above, the semiconductor device 701 can be electrically connected or disconnected with the driver circuit 501 or the redisplaying circuit 601 with use of the connection portion 702. Thus, it is possible to detach the driver circuit 501 and to attach the redisplaying circuit 601.

Although the semiconductor device 701 and the connection portion 702 are separately provided in FIGS. 7A and 7B, the semiconductor device 701 may include the connection portion 702.

Embodiment 8

In this embodiment, an example of a semiconductor device will be described. The semiconductor device can include a circuit in addition to the circuit 100 or the circuit 150 shown in FIGS. 1A and 1B, FIGS. 2A to 2C, FIG. 3, and FIG. 4.

Figure 8A:
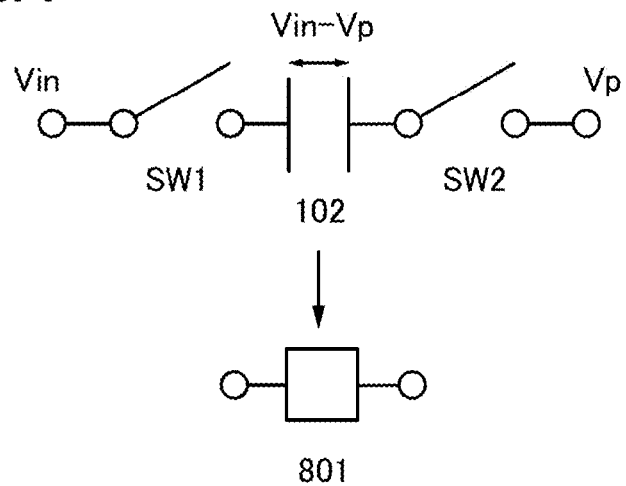

A semiconductor device shown in FIG. 8A includes a display element 801, a capacitor 102, a switching element SW1, and a switching element SW2.

When the switching element SW1 and the switching element SW2 are turned on, a video signal is written to the semiconductor device. Specifically, a potential Vin is supplied to one electrode of the capacitor 102 through the switching element SW1. A potential Vp is supplied to the other electrode of the capacitor 102 through the switching element SW2. Then, the switching element SW1 and the switching element SW2 are turned off, whereby a potential difference between the electrodes (Vin–Vp) is held between the electrodes of the capacitor 102. The potential difference is a voltage corresponding to the video signal.

The display element 101 has a function of performing display in accordance with the potential difference held by the capacitor 102. There is no particular limitation on the circuit configuration as long as the display element 101 has the above function. The switching element SW1 may be provided between the one electrode of the capacitor 102 and a wiring through which the potential Vin is supplied, and the switching element SW2 may be provided between the other electrode of the capacitor 102 and a wiring from which the potential Vp is supplied.

As the switching element SW1 and the switching element SW2, a transistor can be used. In such a case, a method for reducing the off-state current of the transistor, described in Embodiment 1, can be used.

For the semiconductor device shown in FIG. 8A, the operation (0), the operation (1), and the operation (3) which are the stopping operations described in Embodiment 1 can be employed. For example, as the operation (0), the switching element SW1 and the switching element SW2 are turned off. In the case where a transistor is used as a switching element, the potential at which the transistor is turned off is supplied to a gate. Next, as the operation (1), the potential Vin and the potential Vp are set to the same as the potential supplied to the gate. Then, as the operation (3), driving of the semiconductor device is stopped. Specifically, the semiconductor device and a driver circuit used for writing a video signal are electrically disconnected. Note that the driver circuit has a function of supplying the potential Vin and the potential Vp and the potential that controls the on/off of the switching element SW1 and the switching element SW2.

As described above, by the stopping operation, a fluctuation or loss of the voltage of the capacitor 102 can be suppressed in the semiconductor device in FIG. 8A.

Figure 8B:
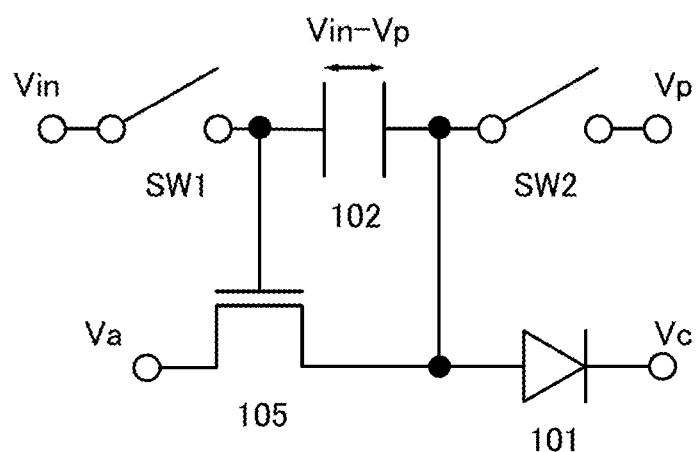

A semiconductor device shown in FIG. 8B is a specific example of the semiconductor device in FIG. 8A. The current flowing through the transistor 105 is controlled in accordance with the voltage held by the capacitor 102, and the current is made to flow in the display element 101. Note that the circuit 100 in FIG. 1A corresponds to the specific circuit configuration in FIG. 8B. In the case of using the circuit 100 in FIG. 1A, the potential Vin is supplied from the wiring SL, the potential Vp is supplied from the wiring V0, and a potential Va is supplied from the wiring ANODE, and a potential Vc is supplied from the wiring CATHODE. Note that a switching element is provided between the wiring ANODE and the transistor 105 and the on/off of the switching element is controlled during the display period or the redisplaying period, whereby display or non-display may be controlled.

Figure 8C:
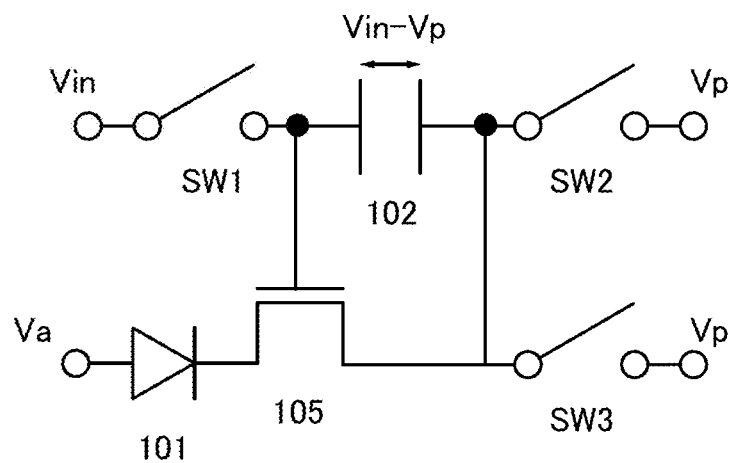

A semiconductor device shown in FIG. 8C is a modified example of the semiconductor device in FIG. 8B. As in the case of FIG. 8B, the amount of current flowing through the transistor 105 is adjusted in accordance with the voltage held by the capacitor 102, and the current can be made to flow in the display element 101. Note that in the case of FIG. 8C, the potential at which the switching element SW3 is turned off may be supplied during the storage operation, and the potential at which the switching element SW3 which is provided between the wiring CATHODE and the transistor 105 is turned on may be supplied during the redisplaying operation. The potential Vp is the same as the potential Vc of the wiring CATHODE.

Figure 9A:
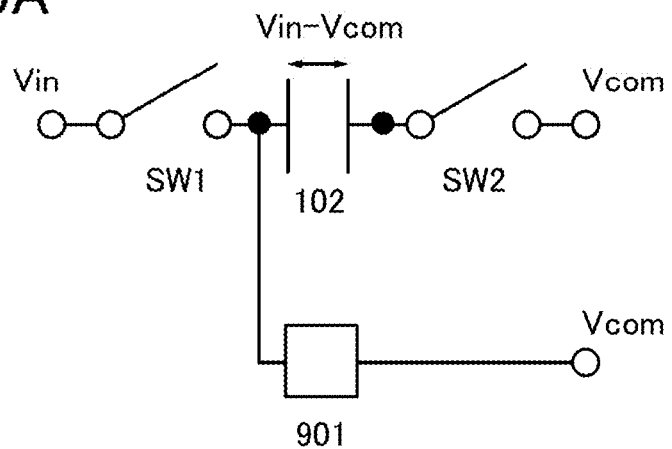

A semiconductor device shown in FIG. 9A is a specific example of the semiconductor device in FIG. 8A. The semiconductor device in FIG. 9A includes a display element 901, the capacitor 102, the switching element SW1, and the switching element SW2. As the display element 901, a liquid crystal element, an electrophoretic element, or the like can be used. One electrode of the display element 901 is electrically connected to one electrode of the capacitor 102. The other electrode of the display element 901 is electrically connected to a common wiring Vcom.

The one electrode of the capacitor 102 is supplied with the potential Vin through the switching element SW1 when the switching element SW1 is on. In a similar manner, the one electrode of the display element 901 is supplied with the potential Vin. The other electrode of the capacitor 102 is supplied with the potential Vcom through the switching element SW2 when the switching element SW2 is on. Then, the switching element SW1 and the switching element SW2 are turned off, whereby the potential difference (Vin–Vcom) between the electrodes of the capacitor 102 is held. The potential difference is the voltage corresponding to the video signal.

The display element 901 has a function of performing display in accordance with the voltage held by the capacitor 102.

Figure 9B:
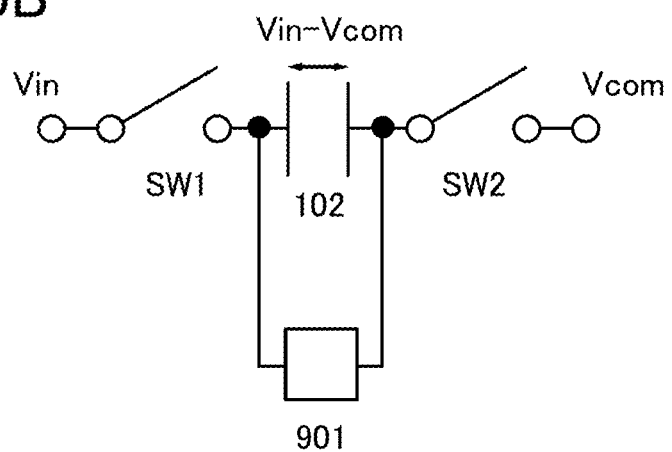

A semiconductor device shown in FIG. 9B is a modified example of the semiconductor device in FIG. 9A. A difference from FIG. 9A is that the other electrode of the display element 901 is electrically connected to the other electrode of the capacitor 102 and also electrically connected to the common wiring Vcom through the switching element SW2.

Figure 9C:
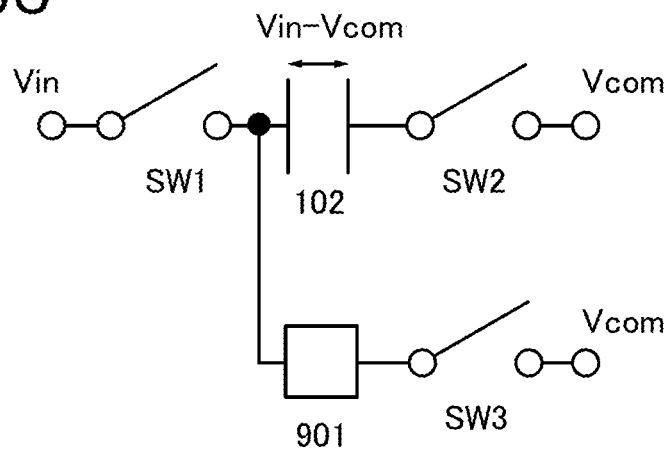

A semiconductor device shown in FIG. 9C is a modified example of the semiconductor device in FIG. 9A. A difference from FIG. 9A is that the other electrode of the display element 901 is electrically connected to the common wiring Vcom through the switching element SW3. The switching element SW3 may be turned on during the writing period of a video signal or the display period.

For the semiconductor devices shown in FIGS. 9A to 9C, the operation (0), the operation (1), and the operation (3) which are the stopping operations can be employed as in the case of the semiconductor device in FIG. 8A. For example, as the operation (0), the switching element SW1, the switching element SW2, and the switching element SW3 are turned off. In the case of using a transistor as the switching element, the potential at which the transistor is turned off is supplied to a gate. Next, as the operation (1), the potential Vin and the potential Vcom are set to the same as the potential supplied to the gate. Then, as the operation (3), the driving of the semiconductor device is stopped. Specifically, the semiconductor device and a driver circuit used for writing the video signal are electrically disconnected. Note that the driver circuit has a function of supplying the potential that controls the potential Vin and the potential Vcom and the on/off of the switching element SW1 and the switching element SW2. As described above, a fluctuation or loss of the voltage of the capacitor 102 can be suppressed in the semiconductor devices shown in FIGS. 9A to 9C.

In each of the semiconductor devices shown in FIGS. 8A to 8C and FIGS. 9A to 9C, one electrode and the other electrode of the capacitor are electrically connected to respective switching elements, whereby the voltage between the electrodes of the capacitor can be held by turning the switching element off.

As the switching element SW1, the switching element SW2, and the switching element SW3, transistors can be used. In that case, a method for reducing the amount of off-state current of the transistor described in Embodiment 1 can be employed.

Note that although an example in which the present invention is applied to the semiconductor device including the display element 801 is described in the above, the present invention can also be applied to the semiconductor device without the display element 801. In that case, the semiconductor device may be a circuit including the capacitor 102, the switching element SW1, and the switching element SW2 in FIG. 8A. The circuit can be used as a memory for example. The memory has a function of storing data corresponding to the voltage held at the capacitor 102.

Furthermore, in the semiconductor device without the display element 801, the operation (0), the operation (1), and the operation (3) which are the stopping operations are performed, whereby a fluctuation or loss of the voltage held by the capacitor 102 can be suppressed as much as possible.

Part or the whole of this embodiment can be freely combined with part or the whole of another embodiment.

Embodiment 9

In this embodiment, an example of a semiconductor device will be described. In this embodiment, an example of an oxide semiconductor that can be used for a channel of a transistor is shown.

An oxide semiconductor to be used preferably includes at least indium (In) or zinc (Zn). In addition, as a stabilizer for reducing variation in electric characteristics among transistors formed using such an oxide semiconductor, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among the oxide semiconductors, unlike silicon carbide, gallium nitride, or gallium oxide, an In—Ga—Zn-based oxide, an In—Sn—Zn-based oxide, or the like has an advantage of high mass productivity because a transistor with favorable electrical characteristics can be formed by sputtering or a wet process. Further, unlike silicon carbide, gallium nitride, or gallium oxide, with use of the In—Ga—Zn-based oxide, a transistor with favorable electrical characteristics can be formed over a glass substrate. Further, a larger substrate can be used.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, any of the following oxides can be used, for example: indium oxide, gallium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

Note that, for example, an In—Ga—Zn-based oxide means an oxide containing In, Ga, and Zn and there is no particular limitation on the ratio of In:Ga:Zn. Further, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Further, the In—Ga—Zn-based oxide has high mobility.

For example, an In—Ga—Zn-based oxide with an atomic ratio of In:Ga:Zn=1:1:1 (=1/3:1/3:1/3), In:Ga:Zn=2:2:1 (=2/5:2/5:1/5), In:Ga:Zn=1:4:4 (=1/9:4/9:4/9), or an oxide with an atomic ratio in the neighborhood of the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), In:Sn:Zn=2:1:5 (=1/4:1/8:5/8), or an oxide with an atomic ratio close to any of the above atomic ratios can be used.

For example, with an In—Sn—Zn-based oxide, high mobility can be realized relatively easily. However, even with an In—Ga—Zn-based oxide, mobility can be increased by reducing the defect density in the bulk.

An oxide semiconductor film may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

For example, an oxide semiconductor film may include a CAAC-OS. In the CAAC-OS, for example, c-axes are aligned, and a-axes and/or b-axes are not macroscopically aligned.

For example, an oxide semiconductor film may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example.

Note that an oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that an oxide semiconductor film may be in a single-crystal state, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that among crystal parts, the directions of the a-axis and the b-axis of one crystal part may be different from those of another crystal part. An example of such an oxide semiconductor film is a CAAC-OS film.

Note that in most cases, a crystal part in the CAAC-OS film fits inside a cube whose one side is less than 100 nm. In an image obtained with a transmission electron microscope (TEM), a boundary between crystal parts in the CAAC-OS film is not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, the c-axis is aligned in a direction parallel to a normal vector of a surface where the CAAC-OS film is formed or a normal vector of a surface of the CAAC-OS film. Note that among crystal parts, the directions of the a-axis and the b-axis of one crystal part may be different from those of another crystal part. In this specification, the term "perpendicular" includes a range from 80° to 100°, preferably from 85° to 95°. In addition, the term "parallel" includes a range from −10° to 10°, preferably from −5° to 5°.

When the CAAC-OS film is analyzed by an out-of-plane method with an X-ray diffraction (XRD) apparatus, a peak appears at 2θ of around 31° in some cases. In the case of a crystal of $InGaZnO_4$, the peak at 2θ of around 31° indicates that the crystal of $InGaZnO_4$ has (009) plane alignment. Further, in the CAAC-OS film, a peak appears at 2θ of around 36° in some cases. In the case of a $ZnGa_2O_4$ crystal, the peak at 2θ of around 36° is derived from the (222) plane of the $ZnGa_2O_4$ crystal. In the CAAC-OS film, it is preferable that the peak appear at 2θ of around 31° and do not appear at 2θ of around 36°.

For example, when the CAAC-OS film including a crystal of $InGaZnO_4$ is analyzed with an XRD apparatus by an in-plane method in which an X-ray enters a sample in a direction perpendicular to the c-axis, a peak appears at 2θ of around 56° in some cases. The peak at 2θ of around 56° is derived from the (110) plane of the $InGaZnO_4$ crystal. Here, when analysis (φ scan) is performed with 2θ fixed at around 56° and with a sample rotated using a normal vector of a surface of the sample as an axis (φ axis), although six peaks having symmetry appear in the case of a single crystal oxide semiconductor in which the directions of an a-axis and a b-axis of one crystal part are the same as those of another crystal part, a peak is not clearly observed in the case of the CAAC-OS film.

In the CAAC-OS film, distribution of crystal parts is not necessarily uniform. For example, in the formation process of the CAAC-OS film, in the case where crystal growth occurs from the surface side of the oxide semiconductor film, the proportion of crystal parts in the vicinity of the surface of the oxide semiconductor film is sometimes higher than that in the vicinity of the surface where the oxide semiconductor film is formed. Further, when an impurity is added to the CAAC-OS film, crystallinity of the crystal part in a region to which the impurity is added is lowered in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

With use of the CAAC-OS film in a transistor, variation in electrical characteristics of the transistor due to irradiation with visible light or ultraviolet light is small. Thus, the transistor has high reliability.

For example, the CAAC-OS film is formed by a sputtering method with a polycrystalline metal oxide sputtering target. For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, and nitrogen) which exist in a deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like or pellet-like sputtered particle reaches the substrate, migration occurs on the substrate, so that a flat plane of the sputtered particle is attached to the substrate.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

The oxide semiconductor layer is not limited to a single-layer metal oxide film and may have a stacked structure of a plurality of metal oxide films. In a semiconductor film in which first to third metal oxide films are sequentially stacked, for example, the first metal oxide film and the third metal oxide film are each an oxide film which contains at least one of the metal elements contained in the second metal oxide film and whose lowest conduction band energy is closer to the vacuum level than that of the second metal oxide film by higher than or equal to 0.05 eV, 0.07 eV, 0.1 eV, or 0.15 eV and lower than or equal to 2 eV, 1 eV, 0.5 eV, or 0.4 eV. Further, the second metal oxide film preferably contains at least indium in order to increase the carrier mobility.

In the transistor including the above oxide semiconductor film, when a voltage is applied to the gate electrode so that an electric field is applied to the semiconductor film, a channel region is formed in the second metal oxide film whose lowest conduction band energy is small in the semiconductor film. That is, since the third metal oxide film is provided between the second metal oxide film and the gate insulating film, a channel region can be formed in the second metal oxide film which is insulated from the gate insulating film.

Since the third metal oxide film contains at least one of the metal elements contained in the second metal oxide film, interface scattering is unlikely to occur at the interface between the second metal oxide film and the third metal oxide film. Thus, the movement of carriers is unlikely to be inhibited at the interface, which results in an increase in the field-effect mobility of the transistor.

Further, when an interface level is formed at the interface between the second metal oxide film and the first metal oxide film, a channel region is formed also in the vicinity of the interface, which causes a change in the threshold voltage of the transistor. However, since the first metal oxide film contains at least one of the metal elements contained in the second metal oxide film, an interface level is unlikely to be formed at the interface between the second metal oxide film and the first metal oxide film. Accordingly, the above structure allows reducing of variations in the electrical characteristics of the transistor, such as the threshold voltage.

Further, it is preferable that a plurality of oxide semiconductor films be stacked so that an interface level due to an impurity existing between the metal oxide films, which inhibits carrier flow, is not formed at the interface between the metal oxide films. This is because when an impurity exists between the stacked metal oxide films, the continuity of the lowest conduction band energy between the metal oxide films is lost, and carriers are trapped or disappear by recombination in the vicinity of the interface. By reducing an impurity existing between the films, a continuous junction (here, in particular, a U-shape well structure whose lowest conduction band energy is changed continuously between the films) is formed more easily than the case of merely stacking a plurality of metal oxide films which share at least one main metal component.

In order to form such a continuous energy band, it is necessary to form films continuously without being exposed to air, with use of a multi-chamber deposition apparatus (sputtering apparatus) including a load lock chamber. Each chamber of the sputtering apparatus is preferably evacuated to a high vacuum (to about $5\times10^{-7}$ Pa to $1\times10^{-4}$ Pa) by an adsorption vacuum pump such as a cryopump so that water and the like acting as impurities for the oxide semiconductor are removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the above gas has a dew point of $-40°$ C. or lower, preferably $-80°$ C. or lower, further preferably $-100°$ C. or lower and is highly purified, moisture and the like can be prevented from entering the oxide semiconductor film as much as possible.

The first metal oxide film or the third metal oxide film may be an oxide film containing aluminum, silicon, titanium, gallium, germanium, yttrium, zirconium, tin, lanthanum, cerium, or hafnium at a higher atomic ratio than the second metal oxide film. Specifically, the first metal oxide film or the third metal oxide film may be an oxide film containing the above element at an atomic ratio 1.5 times or more, preferably twice or more, and more preferably three times or more that in the second metal oxide film. The above element is strongly bonded to oxygen, and thus has a function of suppressing generation of oxygen vacancies in the oxide film. That is, oxygen vacancies are less likely to be generated in the first metal oxide film or the third metal oxide film than in the second metal oxide film.

The first metal oxide film and the third metal oxide film each have a thickness greater than or equal to 3 nm and less than or equal to 100 nm, preferably greater than or equal to 3 nm and less than or equal to 50 nm. The second metal oxide film has a thickness greater than or equal to 3 nm and less than or equal to 200 nm, preferably greater than or equal to 3 nm and less than or equal to 100 nm, and further preferably greater than or equal to 3 nm and less than or equal to 50 nm.

In the three-layer semiconductor film, the first metal oxide film and the third metal oxide film can be amorphous or crystalline. Note that the second metal oxide film in which a channel region is formed preferably has a crystalline structure, in which case the transistor can have stable electrical characteristics.

The oxide semiconductor described in this embodiment is used for the transistor described in another embodiment, whereby a novel semiconductor device can be provided. Further, the reliability or characteristics of the semiconductor device can be improved. In particular, when the oxide semiconductor described in this embodiment is used for the first transistor 103 and the second transistor 104 described in the above embodiment, the off-state current of the transistor can be extremely reduced.

Part or the whole of this embodiment can be freely combined with part or the whole of another embodiment.

Embodiment 10

Figure 10A:
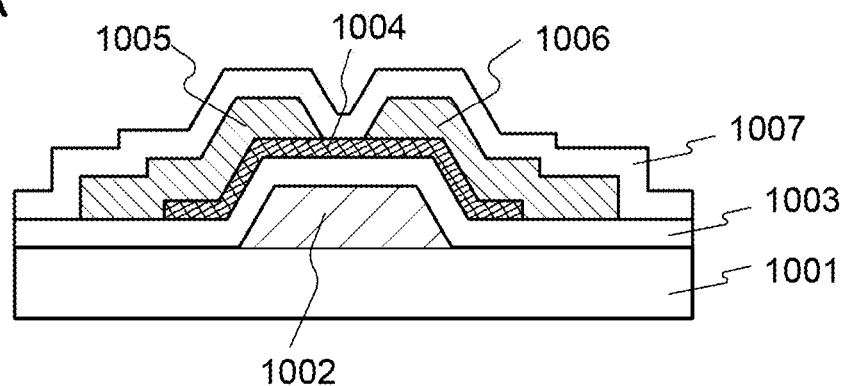
Figure 10B:
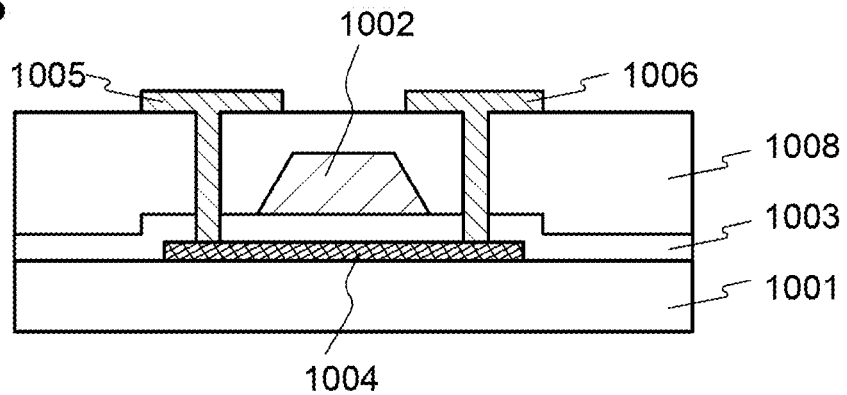

In this embodiment, an example of a semiconductor device will be described. FIGS. 10A and 10B each illustrate an example of a semiconductor device.

The semiconductor device illustrated in FIG. 10A includes a transistor having a bottom-gate structure. The transistor includes a conductive layer 1002 over a substrate 1001, an insulating film 1003 over the conductive layer 1002, a semiconductor layer 1004 over the insulating film 1003, and a conductive layer 1005 and a conductive layer 1006 electrically connected to the semiconductor layer 1004. In addition, an insulating film 1007 may be provided over the semiconductor layer 1004. Note that the transistor may have a channel-etched structure or a channel protective structure. In the case of a channel protective transistor, an insulating film may be provided to be in contact with a channel formation region of the semiconductor layer 1004.

The semiconductor device illustrated in FIG. 10B includes a transistor having a top gate structure. The transistor includes the semiconductor layer 1004 over the substrate 1001, the insulating film 1003 over the semiconductor layer 1004, the conductive layer 1002 over the insulating film 1003, an insulating film 1008 over the conductive layer 1002, and the conductive layer 1005 and the conductive layer 1006 over the insulating film 1008. The conductive layer 1005 and the conductive layer 1006 are electrically connected to the semiconductor layer 1004 through contact holes (also referred to as opening) in the insulating film 1003 and the insulating film 1008.

As the substrate 1001, a glass substrate, a plastic substrate, a ceramic substrate, or the like can be used. Alternatively, a silicon substrate on which an insulating film such as a silicon oxide film or a silicon nitride film is formed or a metal substrate typified by a stainless steel substrate may be used.

Needless to say, a quartz substrate may be used. In particular, with a plastic substrate or the like, a flexible semiconductor device can be formed.

The semiconductor layer 1004 preferably includes an oxide semiconductor. For the oxide semiconductor, a structure or composition described in Embodiment 9 can be employed. Note that as the semiconductor layer 1004, other than the oxide semiconductor, a variety of semiconductors can be used, for example, a semiconductor containing a semiconductor (e.g., silicon) belonging to Group 14, an organic semiconductor, a compound semiconductor, or the like. Moreover, an amorphous semiconductor, a microcrystalline semiconductor, a polycrystalline semiconductor, a single crystal semiconductor, or the like can be used.

The insulating film 1003 functions as a gate insulating film. As a material of the insulating film 1003, silicon nitride, silicon oxide, silicon oxynitride, silicon nitride oxide, or the like can be used. Alternatively, a hafnium oxide, a zirconium oxide, a lanthanum oxide, an aluminum oxide, a magnesium oxide, a tantalum oxide, a cerium oxide, a neodymium oxide, or the like may be used. Further alternatively, a plurality of insulating films including any of the above materials may be stacked. Note that as each of the insulating film 1007 and the insulating film 1008, a single layer or a stacked layer of the insulating film including any of the above materials may be used.

The conductive layer 1002 functions as a gate electrode. The conductive layer 1005 functions as one of a source electrode and a drain electrode. The conductive layer 1006 functions as the other of the source electrode and the drain electrode. In FIG. 10A, the width of the conductive layer 1002 is larger than the width of the semiconductor layer 1004 in the channel length direction of the transistor. In that case, the conductive layer 1002 functions as a light-blocking layer, and light irradiation on the semiconductor layer 1004 on the conductive layer 1002 side can be suppressed. It is particularly effective to provide the light-blocking layer because the semiconductor layer including an oxide semiconductor has a possibility that electrical characteristics deteriorates due to light irradiation. In FIG. 10B, it is effective to provide a light-blocking layer below the semiconductor layer 1004.

Each of the conductive layer 1002, the conductive layer 1005, and the conductive layer 1006 may be formed using one element or a plurality of elements selected from aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), magnesium (Mg), scandium (Sc), cobalt (Co), zinc (Zn), niobium (Nb), silicon (Si), phosphorus (P), boron (B), arsenic (As), gallium (Ga), indium (In), tin (Sn), or oxygen (O). Alternatively, a compound or an alloy including any of the above elements may be used. As the compound, a light-transmitting material such as an In—Sn-based oxide (ITO), an In—Zn-based oxide, an In—Sn-based oxide containing silicon oxide, or zinc oxide (ZnO) may be used, for example. As the alloy, aluminum-neodymium (Al—Nd), magnesium-silver (Mg—Ag), molybdenum-niobium (Mo—Nb), or the like may be used.

Alternatively, as the material of each of the conductive layer 1002, and the conductive layer 1005, and the conductive layer 1006, an In—Ga—Zn-based oxide containing nitrogen, an In—Sn-based oxide containing nitrogen, an In—Ga-based oxide containing nitrogen, an In—Zn-based oxide containing nitrogen, a Sn-based oxide containing nitrogen, an In-based oxide containing nitrogen, or a metal nitride film (such as an indium nitride film, a zinc nitride film, a tantalum nitride film, or a tungsten nitride film) may be used. These materials have a work function of 5 eV or more. Thus, when such a material is used as the gate electrode, the threshold voltage of the transistor can be a positive value, and formation of a normally-on transistor can be suppressed. Furthermore, when the material of the source or drain electrode is the same as the material of the semiconductor layer 1004, an interface between the source or drain electrode and the semiconductor layer 1004 can be stable.

An example of a method for manufacturing a semiconductor device shown in FIG. 10A will be described.

Over the substrate 1001, the conductive layer 1002 (including a conductive layer formed from the same layer) is formed. The conductive layer 1002 may have a tapered shape with a taper angle greater than or equal to 15° and less than or equal to 70° for example. Here, the taper angle refers to an angle formed between a side surface of a layer having a tapered shape and a bottom surface of the layer.

Next, over the conductive layer 1002, the insulating film 1003 is formed by a CVD method, a sputtering method, or the like. In the case where the semiconductor layer 1004 formed in a later step includes an oxide semiconductor, a region in the insulating film 1003 in contact with the semiconductor layer 1004 preferably contains oxygen. In particular, the region is preferably a region containing oxygen in excess of the stoichiometric composition (also referred to as oxygen-excess region). In order to provide the oxygen-excess region, the insulating film 1003 is formed in an oxygen atmosphere, for example. Alternatively, oxygen may be introduced by an ion implantation method, an ion doping method, a plasma immersion ion implantation method, plasma treatment, or the like. Also in the insulating film 1007 and the insulating film 1008, an oxygen-excess region may be provided.

Next, over the insulating film 1003, a semiconductor film that is to be the semiconductor layer 1004 is formed. For formation of the semiconductor, a sputtering method, a molecular beam epitaxy (MBE method), a CVD method, a pulsed laser deposition method, an atomic layer deposition (ALD) method, or the like can be used as appropriate.

The insulating film 1003 and the semiconductor film are preferably formed in succession without exposure to the air. By forming the films in succession without exposure to the air, attachment of hydrogen or a hydrogen compound (e.g., adsorption water) onto surfaces of the semiconductor film can be prevented. Thus, the entry of impurities can be prevented.

A sputtering target which is polycrystalline and has a high relative density (a high filling rate) is used in the case where an oxide semiconductor film is deposited by a sputtering method as the semiconductor film. The semiconductor film is formed under the following conditions: the sputtering target in deposition is sufficiently cooled to room temperature; the temperature of a surface of a deposition-target substrate where the semiconductor film is to be formed is increased to room temperature or higher; and an atmosphere in a deposition chamber hardly contains moisture or hydrogen.

The higher density of the sputtering target is more preferable. When the density of the sputtering target is increased, the density of a film to be deposited can also be increased. Specifically, the relative density (the filling rate) of the sputtering target is set to higher than or equal to 90% and lower than or equal to 100%, preferably higher than or equal to 95%, further preferably higher than or equal to 99.9%. Note that the relative density of the sputtering target refers to a ratio of the density of the sputtering target to the density of a material free of porosity having the same composition as the sputtering target.

The sputtering target is preferably sintered in an inert gas atmosphere (a nitrogen atmosphere or a rare gas atmosphere), in vacuum, or in a high-pressure atmosphere. As a sintering method, an atmospheric sintering method, a pressure sintering method, or the like can be used as appropriate. A polycrystalline target obtained by any of these methods is used as a sputtering target. A hot pressing method, a hot isostatic pressing (HIP) method, a discharge plasma sintering method, or an impact method is preferably used as a pressure sintering method. The maximum temperature at which sintering is performed is selected depending on the sintering temperature of the sputtering target material, and it is preferably set to approximately 1000° C. to 2000° C., or further preferably, 1200° C. to 1500° C. The holding time of the maximum temperature is selected depending on the sputtering target material, and 0.5 hours to 3 hours is preferable.

In the case of forming an In—Ga—Zn-based oxide film, a target having an atomic ratio of In:Ga:Zn=3:1:2, a target having an atomic ratio of In:Ga:Zn=1:1:1, or the like is used as the sputtering target.

To obtain a dense film, it is important to reduce an impurity remaining in the deposition chamber. The back pressure (ultimate vacuum: degree of vacuum before introduction of a reaction gas) in the deposition chamber is set to be lower than or equal to $5 \times 10^{-3}$ Pa, preferably lower than or equal to $6 \times 10^{-5}$ Pa, and the pressure in deposition is set to be lower than 2 Pa, preferably lower than or equal to 0.4 Pa. The impurity in the deposition chamber is reduced by setting the back pressure to be low.

To obtain a dense film, it is also important to reduce an impurity contained in a gas that is introduced into the deposition chamber, i.e., a gas used at the deposition. Further, it is important to increase the proportion of oxygen contained in the deposition gas and optimize power. By increasing the proportion of oxygen (the upper limit: 100% oxygen) in the deposition gas and optimizing the power, plasma damage in deposition can be alleviated. Thus, a dense film is easily obtained.

Furthermore, for monitoring the amount of moisture and the like in the deposition chamber before and during the deposition, the deposition is preferably performed in a state where a quadrupole mass analyzer (hereinafter referred to as Q-mass) is always in operation.

For example, as the deposition gas supplied into the deposition chamber of a sputtering apparatus, oxygen or a mixed gas of oxygen and a highly purified rare gas from which an impurity such as hydrogen, water, a hydroxyl group or a hydride (hereinafter, referred to as hydrogen) is removed is used.

Note that heat treatment for dehydration or dehydrogenation may be performed as appropriate on the deposited semiconductor film. Further, oxygen may be supplied to the semiconductor film which has been subjected to dehydration or dehydrogenation treatment. As described above, it is preferable that impurities such as hydrogen be reduced in the semiconductor film including an oxide semiconductor as much as possible and oxygen be included to have high purity.

Next, the semiconductor film is processed by etching treatment using a photolithography method into the island-shaped semiconductor layer 1004.

Next, over the semiconductor layer 1004, a conductive film is formed and processed, so that the conductive layer 1005 and the conductive layer 1006 (including a conductive film formed from the same layer) are formed.

Next, the insulating film 1007 is formed by a CVD method, a sputtering method, or the like. In particular, in the case where the semiconductor layer 1004 includes an oxide semiconductor, it is preferable to form the insulating film 1007 containing oxygen. To form the insulating film 1007 containing oxygen in contact with the semiconductor layer 1004, oxygen can be supplied to the semiconductor layer 1004. Furthermore, it is effective to provide a plurality of insulating films 1007 containing oxygen to be stacked. With the stacked structure, the amount of supplied oxygen can be increased.

For example, the insulating film 1007 may be formed under the following conditions: the substrate placed in a deposition chamber of a plasma CVD apparatus, which is vacuum-evacuated, is held at a temperature higher than or equal to 180° C. and lower than or equal to 400° C., preferably higher than or equal to 200° C. and lower than or equal to 370° C., the pressure in the deposition chamber is greater than or equal to 30 Pa and less than or equal to 250 Pa, preferably greater than or equal to 40 Pa and less than or equal to 200 Pa with introduction of a source gas into the deposition chamber, and high-frequency power is supplied to an electrode provided in the deposition chamber. Under the above conditions, an insulating film into which and from which oxygen is diffused can be formed.

After the formation of the insulating layer containing oxygen, a silicon oxide film or a silicon oxynitride film may be formed under the following conditions: the substrate placed in a deposition chamber of the plasma CVD apparatus, which is vacuum-evacuated, without exposure to the air is held at a temperature higher than or equal to 180° C. and lower than or equal to 250° C., preferably higher than or equal to 180° C. and lower than or equal to 230° C., the pressure in the deposition chamber is greater than or equal to 100 Pa and less than or equal to 250 Pa, preferably greater than or equal to 100 Pa and less than or equal to 200 Pa with introduction of a source gas into the deposition chamber, and high-frequency power higher than or equal to 0.17 W/cm$^2$ and lower than or equal to 0.5 W/cm$^2$, preferably higher than or equal to 0.26 W/cm$^2$ and lower than or equal to 0.35 W/cm$^2$ is supplied to an electrode provided in the deposition chamber. Under the above conditions, the decomposition efficiency of the source gas in plasma is enhanced, oxygen radicals are increased, and oxidation of the source gas is promoted; thus, the oxygen content in the formed silicon oxide film or silicon oxynitride film is in excess of that in the stoichiometric composition. However, in the case where the substrate temperature is within the above temperature range, the bond between silicon and oxygen is weak, and accordingly, part of oxygen is released by heating. Thus, it is possible to form an insulating layer which contains oxygen in excess of the stoichiometric composition and from which part of oxygen is released by heating.

The semiconductor device in this embodiment can be used as the transistor in another embodiment.

Part or the whole of this embodiment can be freely combined with part or the whole of another embodiment.

Embodiment 11

Figure 11A:
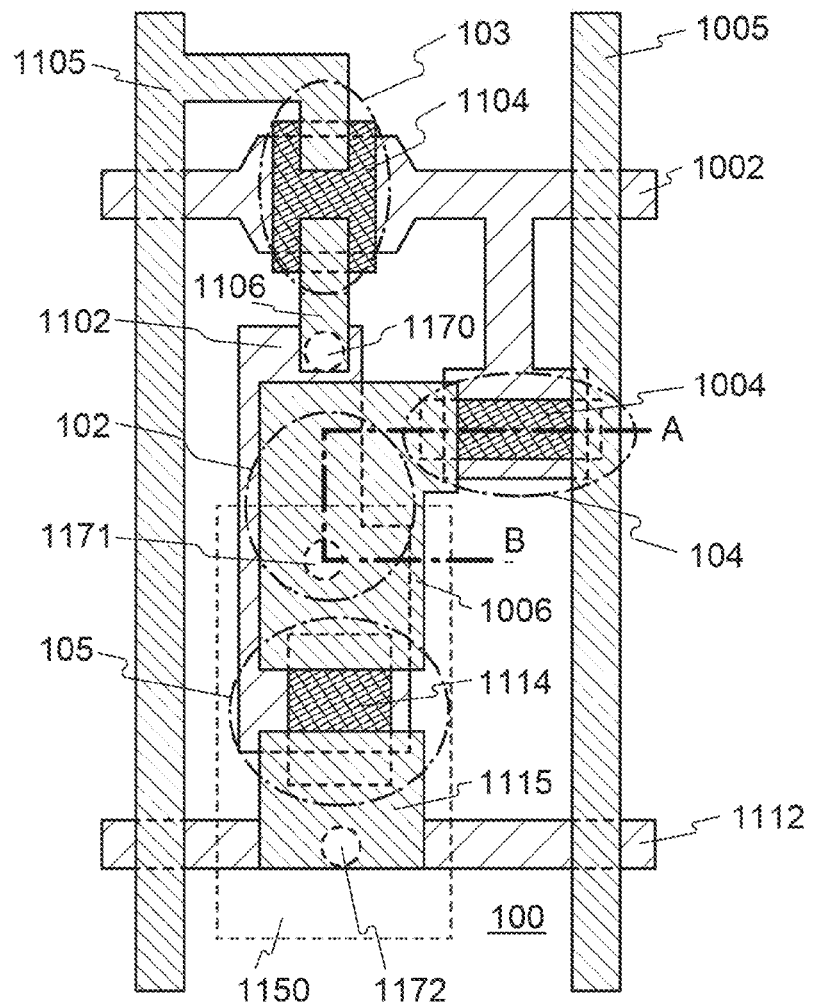
Figure 11B:
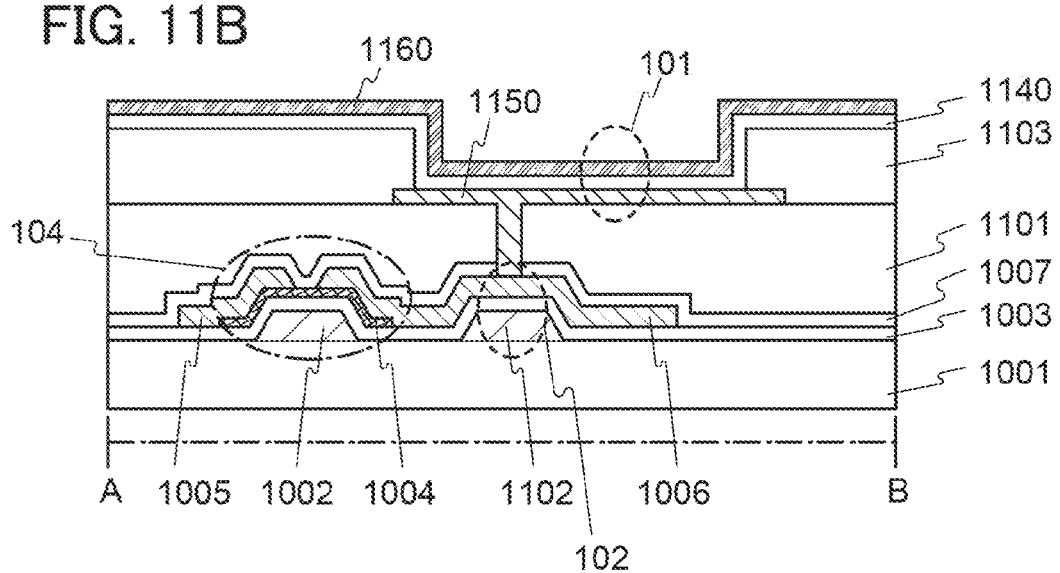

In this embodiment, an example of a semiconductor device will be described. FIG. 11A is a plan view (also referred to as layout) of the semiconductor device. FIG. 11B is a cross-sectional view taken along line A-B in FIG. 11A.

FIG. 11A is a layout of the circuit 100 shown in FIG. 1A and includes the first transistor 103, the second transistor 104, the third transistor 105, and the capacitor 102. The conductive layer 1002 indicates the wiring GL, a conductive layer 1105 indicates the wiring SL, the conductive layer 1005 indicates the wiring V0, a conductive layer 1112 indicates the wiring ANODE, and a conductive layer 1150 indicates one electrode of the display element 101. In FIG. 11B, the other electrode of the display element 101 is not shown. The other electrode can be provided to cover the entire surface of the circuit 100.

The conductive layer 1002, the conductive layer 1102, and the conductive layer 1112 are provided in the same layer and obtained through the same process performed on a conductive film. The conductive layer 1005, the conductive layer 1105, the conductive layer 1115, the conductive layer 1006, and a conductive layer 1106 are provided in the same layer and obtained through the same process performed on the conductive film.

A semiconductor layer 1104 of the first transistor 103, the semiconductor layer 1004 of the second transistor 104, and a semiconductor layer 1114 of the third transistor 105 are provided in the same layer and obtained through the same process performed on a semiconductor film. Furthermore, the semiconductor layer 1004 and the semiconductor layer 1114 may be one continuous layer (series layer) or separate layers. Furthermore, a semiconductor layer may be included in the capacitor 102. In that case, the semiconductor layer of the capacitor 102 and one of or both the semiconductor layer 1004 and the semiconductor layer 1114 may be one layer.

The semiconductor layer 1104 is electrically connected to the conductive layer 1102 through the conductive layer 1106. The conductive layer 1106 is electrically connected to the conductive layer 1102 through a contact hole 1170.

The semiconductor layer 1004 is electrically connected to the conductive layer 1150 and the semiconductor layer 1114 through the conductive layer 1006. In addition, the conductive layer 1006 is electrically connected to the conductive layer 1150 through a contact hole 1171.

The semiconductor layer 1114 is electrically connected to the conductive layer 1112 through the conductive layer 1115. The conductive layer 1115 is electrically connected to the conductive layer 1112 through a contact hole 1172.

When the contact hole 1171 is provided in a position overlapping with the conductive layer 1102, an area of the capacitor 102 can be increased.

The conductive layer 1002 and the conductive layer 1112 are preferably provided so as not to intersect with each other in the circuit 100. The conductive layer 1112 is preferably provided so as to intersect with the conductive layer 1105 and the conductive layer 1005 in the circuit 100.

The conductive layer 1002 has a first region provided along part of the conductive layer 1105 and a second region whose width is larger than that of the first region. The second region can be used as a gate electrode of the first transistor 103. In that case, the width direction of the second region is set to the channel length direction of the first transistor, whereby the channel length can be increased.

In addition, the conductive layer 1002 has a third region along the conductive layer 1005 and a fourth region whose width is larger than that of the third region. The fourth region can be used as a gate electrode of the second transistor 104. In that case, the width direction of the fourth region can be set to the channel length direction of the second transistor 104, whereby the channel length can be increased.

Furthermore, the conductive layer 1102 has a fifth region overlapping with the conductive layer 1006 and a sixth region that is a continuous region with the fifth region. The fifth region can be used as one electrode of the capacitor 102, and the sixth region can be used as a gate electrode of the third transistor 105.

With the above structure, the number of steps can be reduced or the layout can be improved.

FIG. 11B is a cross-sectional view taken along line A-B in FIG. 11A. In FIG. 11B, over the substrate 1001, the conductive layer 1002, the insulating film 1003, the semiconductor layer 1004, the conductive layer 1005, the conductive layer 1006, and the insulating film 1007 are the same as those in FIG. 10A.

In FIG. 11B, an insulating film 1101 over the insulating film 1007, the conductive layer 1150 over the insulating film 1101, an insulating film 1103 over the conductive layer 1150, a layer 1140 including an organic compound (organic compound layer) over the conductive layer 1150, and a conductive layer 1160 over the organic compound layer 1140 are further provided. The conductive layer 1150 is electrically connected to the conductive layer 1006 through a contact hole provided in the insulating film 1007 and the insulating film 1101. The insulating film 1008 includes an organic substance and has flatness. Note that the insulating film 1008 is not necessarily provided. The insulating film 1103 includes an organic substance and is provided to cover end portions of the conductive layer 1150. The insulating film 1103 functions as a bank.

The organic compound layer 1140 functions as a light-emitting layer of the display element 101. The light-emitting layer can be formed using a variety of EL materials. The light-emitting layer may include an electron transport layer, an electron injection layer, a hole transport layer, a hole injection layer, or the like. In the case of performing color display, a light-emitting layer emitting a red color, a light-emitting layer emitting a green color, and a light-emitting layer emitting a blue color may be provided. In addition, a plurality of light-emitting layers emitting white color may be provided and color display may be performed in the following manner: one of the light-emitting layers is overlapped with a red color filter to express red; another light-emitting layer is overlapped with a green color filter to express green; and another light-emitting layer is overlapped with a blue color filter to express blue.

The conductive layer 1150 has a function of one electrode (pixel electrode) of the display element 101. A material of the conductive layer 1150 can be selected as appropriate from the materials that can be used for the conductive layer 1002. In particular, when light is emitted on the conductive layer 1150 side, a light-transmitting material such as ITO is preferably used. In addition, the conductive layer 1150 may be processed to thin to be a layer having a light-transmitting property.

The conductive layer 1160 has a function of the other electrode (common electrode) of the display element 101. A material of the conductive layer 1160 can be selected as appropriate from the materials that can be used for the conductive layer 1002. In particular, when light is emitted on the conductive layer 1160 side, a light-transmitting material such as ITO is preferably used. In addition, the conductive layer 1160 may be processed to thin to be a layer having a light-transmitting property.

Note that light may be emitted on the both sides of the conductive layer 1150 side and the conductive layer 1160 side. In that case, both the conductive layer 1150 and the conductive layer 1160 are preferably formed using a light-transmitting material.

Figure 12A:
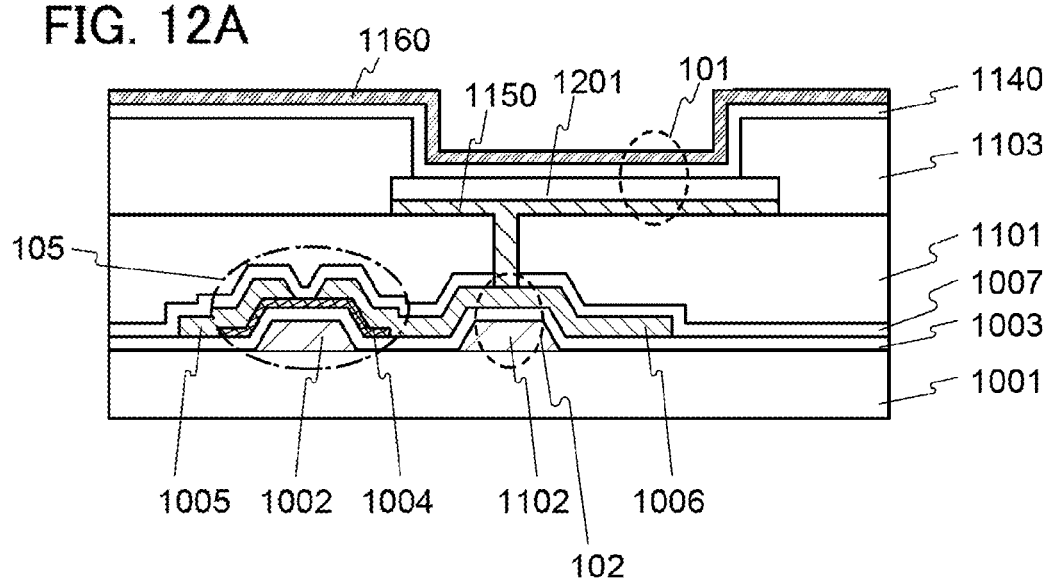

FIG. 12A shows a modified example of FIG. 11B. A difference from FIG. 11B is that a conductive layer 1201 is provided between the conductive layer 1150 and the organic compound layer 1140 of the display element 101 in FIG. 12A.

With the conductive layer 1201, the distance between the conductive layer 1150 and the organic compound layer 1140 can be adjusted. By adjusting the distance, the display element 101 having a micro optical resonator (microcavity) utilizing a resonant effect of light can be obtained. The distance may be changed depending on a displayed color of a pixel or a light-emitting wavelength. For example, it is effective to set the thickness of the conductive layer 1201 in a pixel expressing a red color (the thickness Tr), the thickness of the conductive layer 1201 in a pixel expressing a green color (the thickness Tg), and the thickness of the conductive layer 1201 in a pixel expressing a blue color (the thickness Tb) to Tr>Tg>Tb. In order to adjust the distance, the thickness of the conductive layer 1201 is changed, or the conductive layer 1201 is formed to have a stacked structure including a plurality of conductive layers. It is preferable that the conductive layer 1201 be formed using a light-transmitting material.

Note that the conductive layer 1201 may be provided between the conductive layer 1160 and the organic compound layer 1140.

Figure 12B:
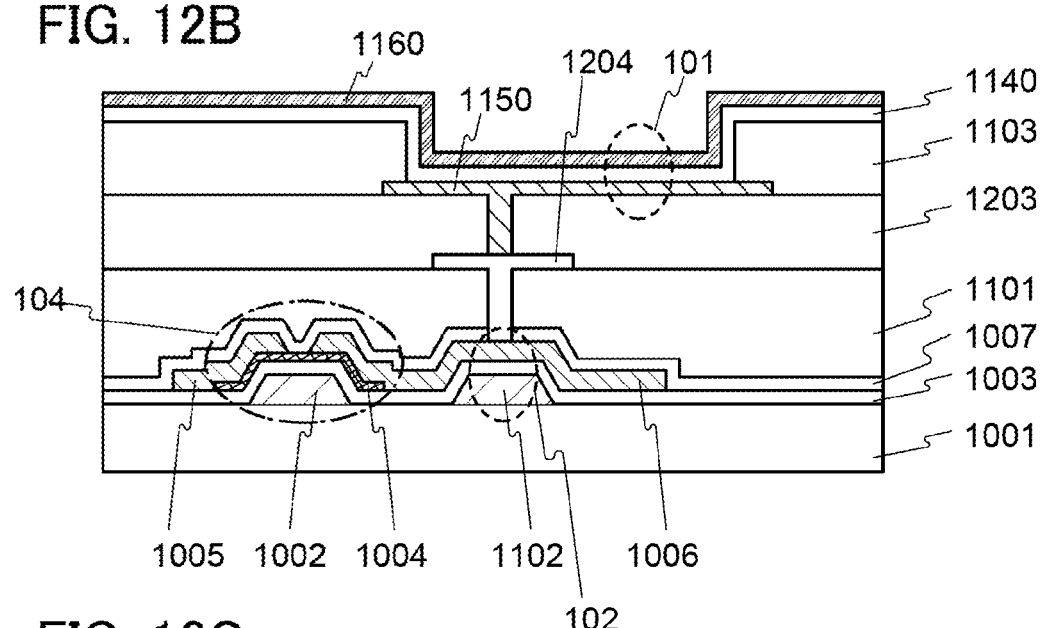

FIG. 12B shows a modified example of FIG. 11B. A difference from FIG. 11B is that a conductive layer 1204 over the insulating film 1101 and an insulating film 1203 over the conductive layer 1204 are provided in FIG. 12B. In other words, the conductive layer 1006 is electrically connected to the conductive layer 1150 through the conductive layer 1204. In addition, the conductive layer 1204 is electrically connected to the conductive layer 1006 through a first contact hole in the insulating film 1101 and the insulating film 1007. The conductive layer 1150 is electrically connected to the conductive layer 1204 through a second contact hole in the insulating film 1203. It is preferable that at least part of the first contact hole overlap with the second contact hole.

Figure 12C:
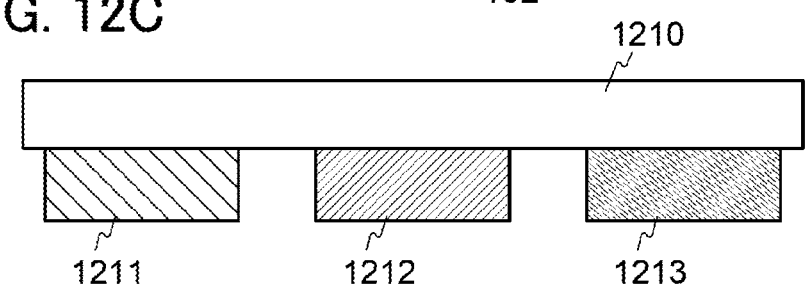

FIG. 12C illustrates an example of a substrate 1210 facing the substrate 1001. The substrate 1210 is provided with a red color filter 1211, a green color filter 1212, and a blue color filter 1213. For example, in the case where all of the display elements 101 in the pixels emit light of the same color (e.g., white), the color filters of three colors are provided in portions overlapping with the circuit 100 in FIG. 11A, whereby a desired color can be expressed. The case illustrated in FIG. 12C shows an example in which light is emitted on the conductive layer 1160 side. In the case where light is emitted on the conductive layer 1150 side, the color filters may be provided on the substrate 1001. In such a case, the color filter can be provided between the substrate 1001 and the insulating film 1003, or the color filter can be provided between the conductive layer 1005 and the conductive layer 1150.

Note that as the substrate 1210, a glass substrate, a plastic substrate, a ceramic substrate, or the like can be used. Alternatively, a silicon substrate on which an insulating film such as a silicon oxide film or a silicon nitride film is formed or a metal substrate typified by a stainless steel substrate may be used. Needless to say, a quartz substrate may be used.

FIG. 13A illustrates an example in which a liquid crystal element is used as the display element 101. The liquid crystal element includes the conductive layer 1150, the conductive layer 1160, and a liquid crystal layer 1301 therebetween. The display element 101 and the transistor 104 in FIG. 13A can be used as the display element 901 and the switching element SW1 in FIGS. 9A to 9C.

Note that the conductive layer 1160 is provided on the substrate 1210. In addition, the color filter in FIG. 12C may be provided on the substrate 1210. Furthermore, a spacer for keeping the distance between the substrate 1001 and the substrate 1210 may be provided between the substrates.

Examples of semiconductor devices including a liquid crystal element include a transmissive semiconductor device, a reflective semiconductor device, and a transflective semiconductor device. A backlight functioning as a light source or the like may be provided.

In addition, a liquid crystal display element may be any one of the following modes: a TN (Twisted Nematic) mode, an IPS (In-Plane-Switching) mode, a FFS (Fringe Field Switching) mode, a MVA (Multi-domain Vertical Alignment) mode, a PVA (Patterned Vertical Alignment) mode, an ASM (Axially Symmetric aligned Micro-cell) mode, an OCB (Optical Compensated Birefringence) mode, a FLC (Ferroelectric Liquid Crystal) mode, or an AFLC (Anti Ferroelectric Liquid Crystal) mode.

FIG. 13B illustrates a modified example of FIG. 13A. For the capacitor 102, a semiconductor layer 1304 formed from the same layer as the semiconductor layer 1004 is used. The capacitor 102 may include the conductive layer 1102 and the semiconductor layer 1304. Alternatively, the capacitor 102 may include the conductive layer 1102, the semiconductor layer 1304, and the conductive layer 1006. Further alternatively, the capacitor 102 may include the semiconductor layer 1304 and the conductive layer 1351. The conductive layer 1351 can be formed in the same layer as the conductive layer 1150. As a material of the semiconductor layer 1304, an oxide semiconductor is used, so that the capacitor 102 can have a light-transmitting property. As a dielectric layer of the capacitor 102, the insulating film 1003, the insulating film 1007, or the insulating film 1101 can be used. The semiconductor layer 1004 and the semiconductor layer 1304 may be one continuous layer or separated layers.

FIG. 13C illustrates a modified example of FIG. 13A. For the capacitor 102, the conductive layer 1150 is used. The capacitor 102 may include the conductive layer 1150 and a conductive layer 1302 formed from the same layer as the conductive layer 1002. Although not shown, the capacitor 102 may include the conductive layer 1150 and a conductive layer in the same layer as the conductive layer 1006.

When the capacitor has the above structure, the capacitance value can be increased, and the storage capability can be improved. It is extremely effective to use such a capacitor combined with the circuit configuration, the stopping operation, or the like in the present invention, for improving the data storage capability of the semiconductor device.

Figure 14:
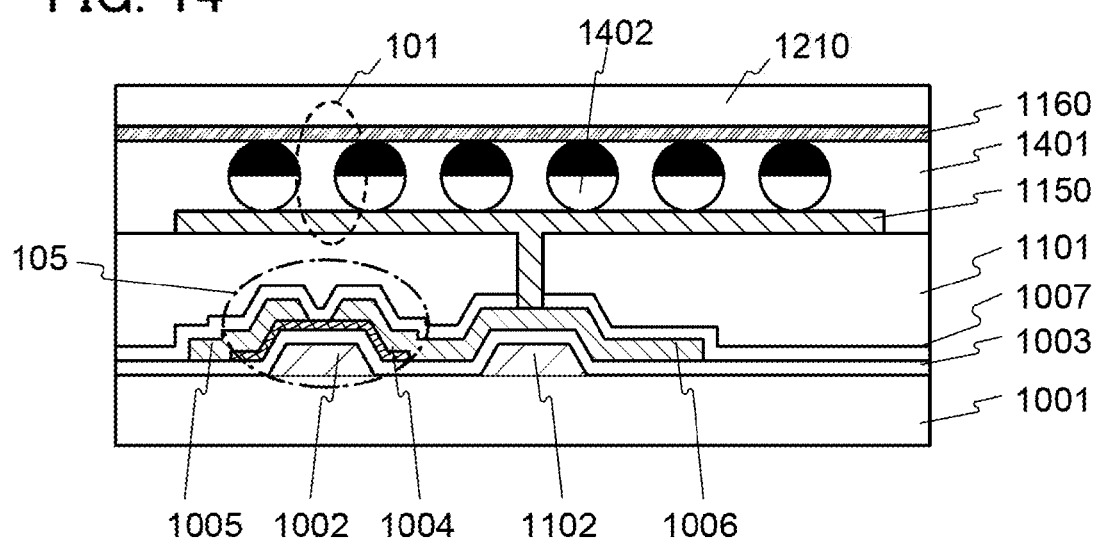

FIG. 14 illustrates an example of using an electrophoretic element as the display element 101. The electrophoretic element has a display layer 1401 between the conductive layer 1150 and the conductive layer 1160. The display layer 1401 includes a plurality of microcapsules 1402 dispersed in a solvent or a solute. Each microcapsule 1402 contains a first particle positively charged and a second particle negatively charged. By application of an electric field to the microcapsules, the particles in the microcapsules move in opposite directions to each other and only the color of the particles gathering on one side is displayed. Note that the first particles and the second particles each contain a pigment and do not move without an electric field. Moreover, the colors of the first particles and the second particles are different from each other (the colors include achromatic color). Note that the display layer 1401 is also referred to as a layer including the microcapsules 1402.

The example of the capacitor 102 illustrated in FIG. 13B or 13C may be used in a semiconductor device including a light-emitting element illustrated in FIGS. 11A and 11B and FIGS. 12A to 12C or may be used in a semiconductor device including an electrophoretic element as illustrated in FIG. 14.

Part or the whole of this embodiment can be freely combined with part or the whole of another embodiment.

Embodiment 12

In this embodiment, an example in which a circuit connected to a semiconductor device is switched between a driver circuit and a redisplaying circuit will be described. The switching example shown in FIGS. 7A and 7B is described more specifically.

Figure 15A:
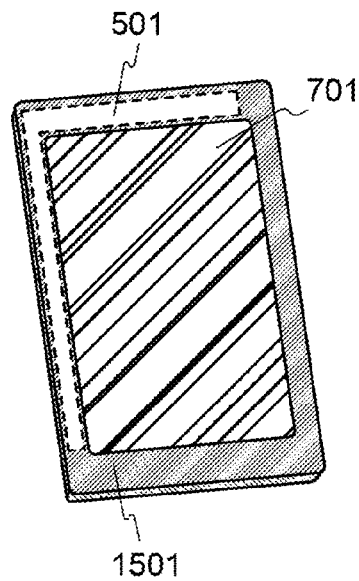

FIG. 15A illustrates a state where a semiconductor device 701 is provided on a component 1501 including the driver circuit 501. In this state, the semiconductor device 701 is electrically connected to the driver circuit 501 through the connection portion 702 shown in FIGS. 7A and 7B (but not shown in FIGS. 15A to 15E). A video signal is written from the driver circuit 501 to the semiconductor device 701.

In the storage period, the semiconductor device 701 and the driver circuit 501 are electrically disconnected, and then, the semiconductor device 701 is detached from the component 1501.

Figure 15B:
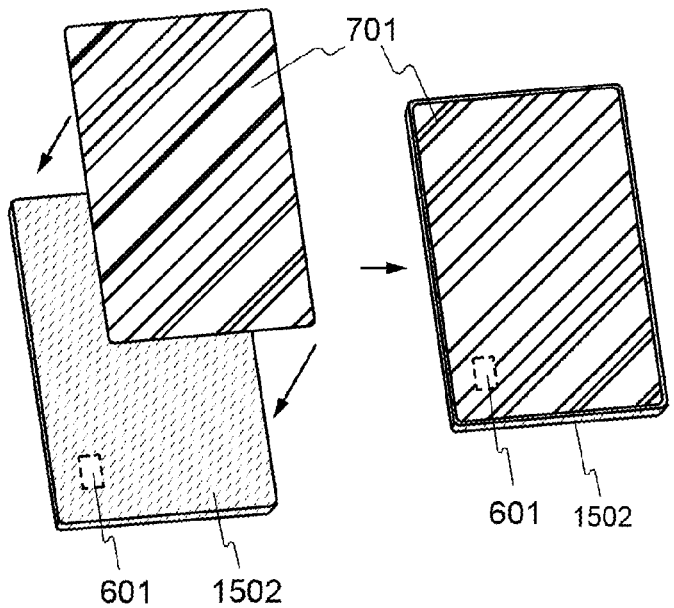

FIG. 15B illustrates a state before the detached semiconductor device 701 is provided on a component 1502 including the redisplaying circuit 601 and a state after the detached semiconductor device 701 is provided on the component 1502.

Since the redisplaying circuit 601 is small, lightweight, or inexpensive as compared with the driver circuit 501, a display device including the component 1502 achieves a reduction in size, weight, or cost, as compared with a display device including the component 1501. Furthermore, the number of power supplies of the redisplaying circuit 601 is smaller than that of the driver circuit 501; thus, the display device including the component 1502 can reduce power consumption. A set of the component and the semiconductor device 701 is called a display device, and the entire display device is called a semiconductor device in some cases.

Figure 15C:
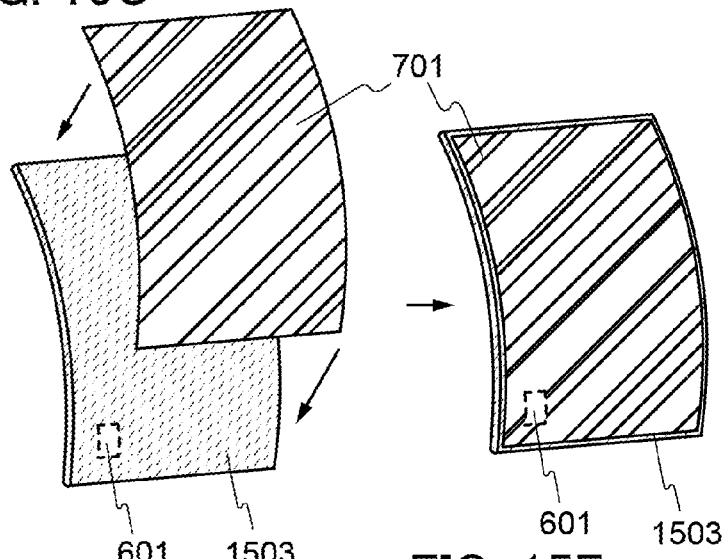

FIG. 15C illustrates a modified example of FIG. 15B, in which the semiconductor device 701 is attached to a component 1503 having a curved surface. The component 1503 is provided with the redisplaying circuit 601. Note that as the component 1503, a component that constantly keeps a curved shape can be used. Alternatively, the component 1503 may be a component that has flexibility and can be changed between a flat shape and a curved shape. Thus, the semiconductor device 701 is preferably formed using a flexible substrate. Examples of the flexible component 1503 or the flexible substrate include a plastic substrate.

Figure 15D:
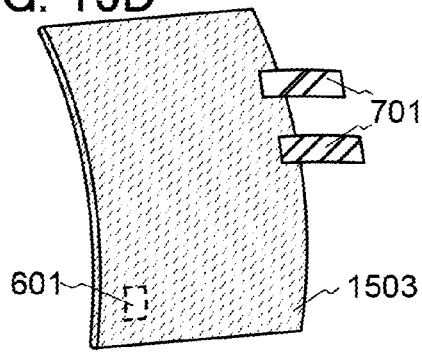

FIG. 15D illustrates a modified example of FIG. 15C. A plurality of semiconductor devices 701 can be provided on the component 1503 provided with the redisplaying circuit 601. The semiconductor devices 701 can be attached to the component 1503 as stamps or tags. In that case, a plurality of semiconductor devices 701 can be provided on the component 1503 with only one redisplaying circuit 601.

Figure 15E:
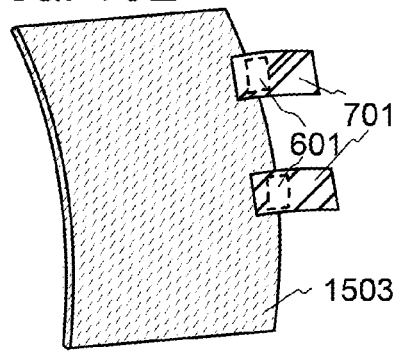

FIG. 15E illustrates a modified example of FIG. 15D. The semiconductor device 701 provided with the redisplaying circuit 601 can be provided on the component 1503. As in the case of FIG. 15D, the semiconductor device 701 can be attached to the component 1503 as a stamp or a tag. Note that the redisplaying circuit 601, a connection wiring, or the like is not needed for the component 1503; thus, the range of application of the component 1503 is markedly increased.

Furthermore, a sensor is provided for the component 1502 or the component 1503, and display, non-display, blinking, image switching, or the like of the semiconductor device 701 may be performed in accordance with a signal from the sensor. Examples of sensors include an acceleration sensor, an angular sensor, a temperature sensor, and an optical sensor. By the sensor, the motion of the display device, the surrounding temperature, the intensity of incident light can be sensed.

In the case of a display device using a light source as a backlight or the like, a light source may be provided for the semiconductor device 701 or the component 1502 or 1503.

Part or the whole of this embodiment can be freely combined with part or the whole of another embodiment.

Embodiment 13

In this embodiment, examples of actual use of display devices performing the redisplaying operation as illustrated in FIGS. 15B to 15E will be described.

FIG. 16 illustrates an example of the display device illustrated in FIG. 15C. The display device includes the component 1503 with a curved surface, the redisplaying circuit 601, and the semiconductor device 701. The component 1503 can be bent in the direction of an arrow 1601. For example, the component 1503 can be worn on an arm, a leg, or the like.

Figure 17A:
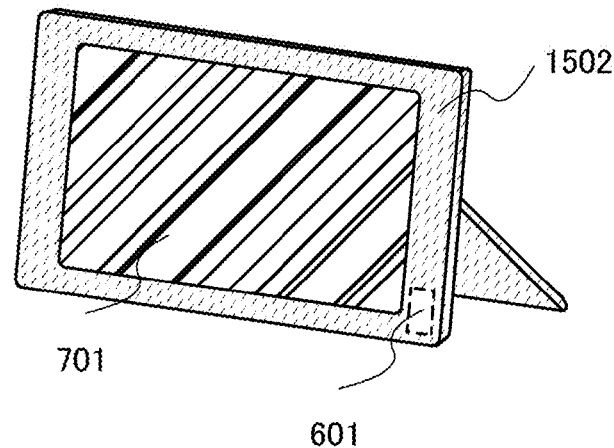

FIG. 17A illustrates an example of the display device illustrated in FIG. 15B. The display device includes the component 1502, the redisplaying circuit 601, and the semiconductor device 701. The display device can be utilized as a photo frame for example.

Figure 17B:
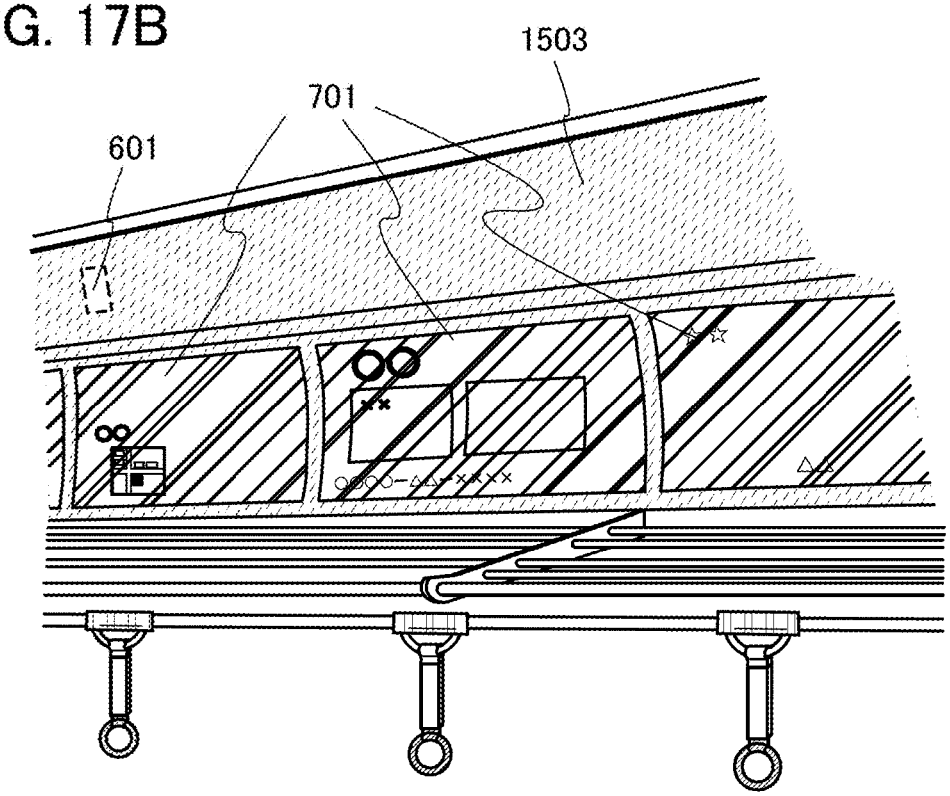

FIG. 17B illustrates an example in which the display device illustrated in FIG. 15C is used for a vehicle such as a train or a bus. As the component 1503, an inner wall, a window, a strap, a seat, a ceiling, or the like can be utilized, and the redisplaying circuit 601 is provided thereon. As application examples of the semiconductor device 701, an advertisement, a hanging poster, or the like can be given.

One embodiment of the present invention is not limited to the above examples but is suitably used as a substitute for a component that displaying one data for a long time, such as a ticket, a poster, or a calendar. In the semiconductor device 701, data can be rewritten only by replacing a driver circuit; thus, a time needed for exchanging a poster, an advertisement, or the like can be extremely shortened.

Part or the whole of this embodiment can be freely combined with part or the whole of another embodiment.

Embodiment 14

In this embodiment, the writing operation, the storage operation, the stopping operation, and the redisplaying operation in an actually prototyped semiconductor device will be described.

<Prototype 1>

In a prototyped semiconductor device, the circuit 150 in which the circuits 100 in FIG. 1A are arranged in matrix was employed as a circuit configuration, and the circuit layout shown in FIGS. 11A and 11B was employed. The display element 101 was an organic EL element, and the capacitor 102 had a capacitance value of 35 fF. The sizes of the first transistor 103, the second transistor 104, and the third transistor 105 were respectively L/W=4 μm/4 μm, L/W=4 μm/6 μm, and L/W=5 μm/7 μm. Each transistor includes an oxide semiconductor.

A video data was written from a driver circuit to the prototyped semiconductor device (the wiring GL=20 V, the wiring SL=potential in accordance with the video data, the wiring V0=0 V, the wiring ANODE=10 V, and the wiring CATHODE=0 V), and display was performed. Then, the following stopping operation was performed. First, as the operation (0), the wiring GL was supplied with 0 V from the driver circuit, and the first transistor 103 and the second transistor 104 were turned off. Next, as the operation (1), the wiring SL and the wiring V0 were supplied with 3.3 V from the driver circuit, and the potentials of the wiring SL and the wiring V0 were set to higher than that of the wiring GL. Next, as the operation (2), the wiring ANODE was supplied with 0 V from the driver circuit to have the same potential as that of the wiring GL. Then, as the operation (3), the driver circuit was detached from the semiconductor device. Note that as the driver circuit, any of the driver circuit 501, the first circuit 502, and the second circuit 503 in FIGS. 5A to 5C was used.

After the semiconductor device was held for a day in such a state that the driver circuit was detached and no power supply was supplied, a redisplaying circuit was connected. As the redisplaying circuit, one shown in FIG. 6C was used. Then, 10 V, 0 V, 3.3 V, and 3.3 V were supplied to the wiring ANODE, the wiring GL, the wiring SL, and the wiring V0, respectively, whereby the display in writing could be recreated. In the conventional semiconductor device including an organic EL element, data cannot be kept just for several seconds in the case where the driver circuit is detached or the case where the driving is sopped; thus, the effectiveness of the circuit configuration or the operation method of one embodiment of the present invention can be proved. Then, a result of holding a state of displaying the data for about an hour, a phenomenon in which the display at the outer edge got dark was observed. As described above, under the above conditions, the displayed data was able to be held for about an hour. However, when the method for reducing the off-state current of a transistor or the method for increasing the capacitance value of a capacitor is employed, for example, data can be held for a longer time.

<Prototype 2>

The results obtained by the stopping operation and the redisplaying operation performed under conditions different from the above are shown below. A difference from the above is that −5 V was supplied to the wiring GL as the operation (0) of the stopping operation and −5 V was supplied to the wiring GL in the redisplaying operation. Other than the difference, the same circuit configuration and operation method as those of Prototype 1 were employed.

As a result of holding the redisplayed data for about 2 hours under the conditions, a phenomenon in which the display at the outer edge got dark was observed. In other words, Prototype 2 performed display for about an hour longer than Prototype 1 did.

Part or the whole of this embodiment can be freely combined with part or the whole of another embodiment.

Example 1

Figure 18A:
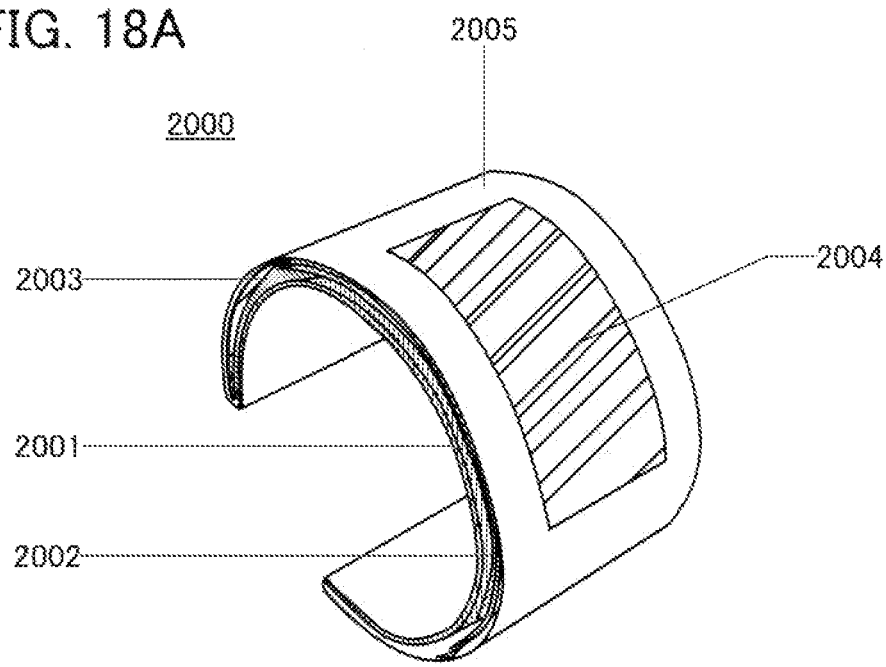
FIGS. 18A to 18C are photographs showing external appearance of a wearable device.
Figure 18B:
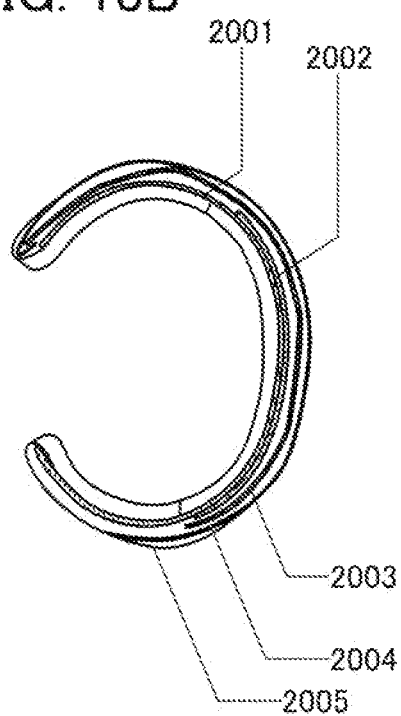
Figure 18C:
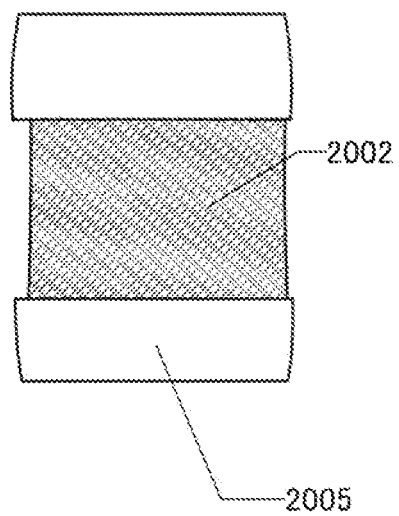

As an example of an electronic device that can be worn on a body, e.g., the wrist or leg, a wearable device 2000 was fabricated using the display device described in the above embodiment. FIG. 18A shows a photograph of an external appearance of the fabricated wearable device 2000. FIG. 18B shows a photograph of a side of the fabricated wearable device 2000. FIG. 18C shows a photograph of a back side of the fabricated wearable device 2000.

The wearable device 2000 includes a base substrate 2001, a secondary battery 2002, a control board 2003, a display device 2004, and a cover 2005. Specifically, the secondary battery 2002 is provided over the base substrate 2001, and the control board 2003 is provided over the secondary battery 2002, and the display device 2004 and the cover 2005 are provided over the control board 2003. In addition, the wearable device 2000 is provided with an antenna (not shown) for wireless charging, and the wireless charging can be performed according to Qi standard.

In the wearable device 2000 described in this example, the base substrate 2001 is formed using a light-transmitting plastic substrate; thus, the secondary battery 2002 can be seen on the back side of the wearable device 2000 (see FIG. 18C). In addition, the base substrate 2001 has flexibility. Accordingly, the base substrate 2001 can be bent easily. Note that a material other than plastic can be used for the base substrate 2001.

The secondary battery 2002 has a laminated structure and flexibility. Accordingly, the secondary battery 2002 can be bent easily. For example, the secondary battery 2002 can be bent along a shape of the base substrate 2001.

Figure 19:
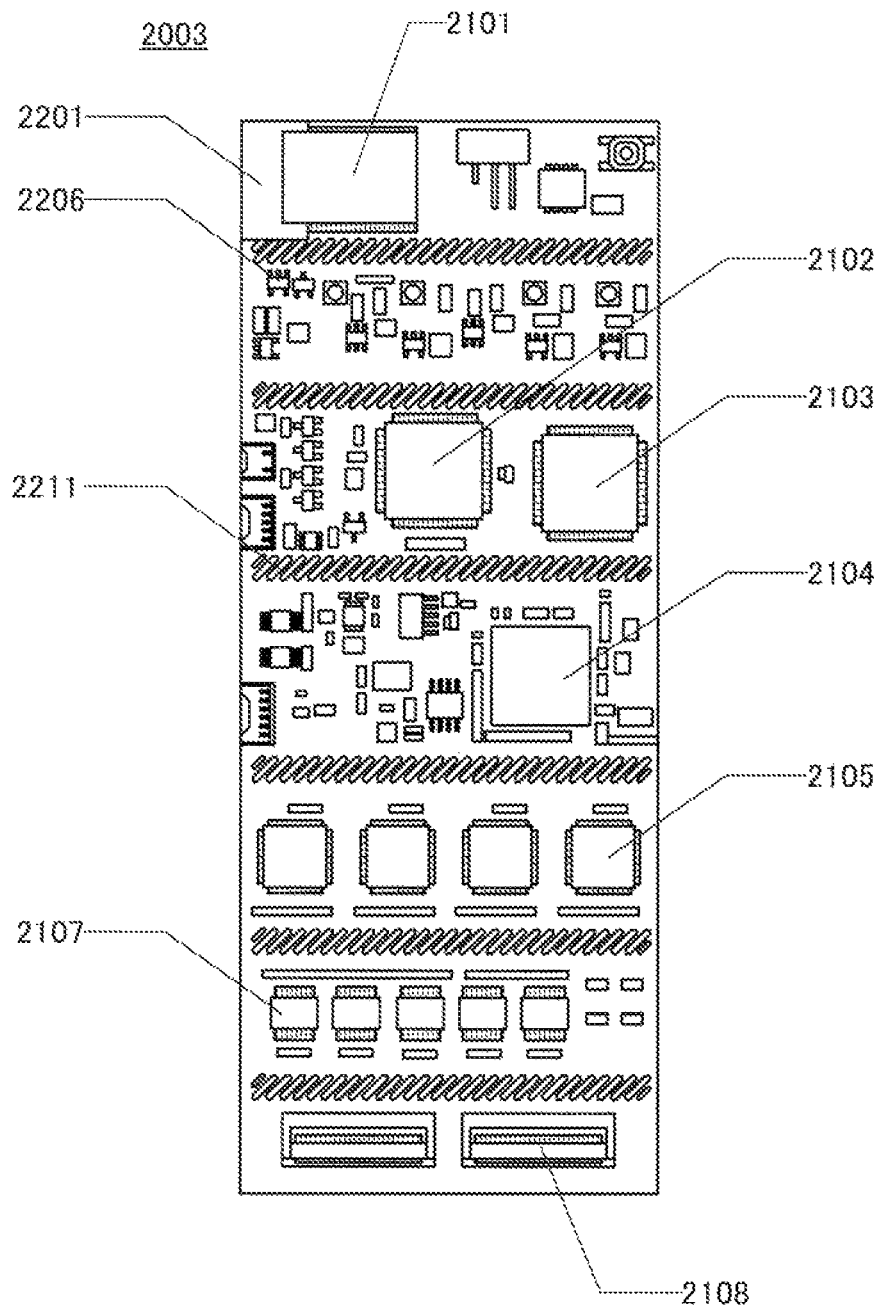
FIG. 19 is a photograph showing external appearance of a control board.

FIG. 19 shows a photograph of an external appearance of the control board 2003. The control board 2003 includes on an FPC 2201 having a slit 2211, a communication device 2101 conforming to Bluetooth (registered trademark, the same as IEEE802.15.1) standards, a microcomputer 2012, a storage device 2103, an FPGA 2104, a DA converter 2105, a charge control IC 2106, and a level shifter 2107. In addition, the control board 2003 is connected to the display device 2004 through an input/output connector 2108. The slit 2211 provided for the FPC 2201 enables the flexibility of the control board 2003 using the FPC 2201 to be increased.

As the display device 2004, the display device described in the above embodiment is used. In addition, a flexible substrate is used in the display device 2004; thus, the display device 2004 can be easily bent.

The wearable device 2000 described in this example can be deformed repeatedly in accordance with a shape of a wearing portion.

This application is based on Japanese Patent Application serial no. 2013-178799 and Japanese Patent Application serial no. 2013-218887 filed with Japan Patent Office on Aug. 30, 2013 and Oct. 22, 2013, the entire contents of which are hereby incorporated by reference.

What is claimed is:

1. A display device comprising:
a connection portion;
a first transistor comprising a first gate, a first source and a first drain;
a second transistor comprising a second gate, a second source and a second drain;
a third transistor comprising a third gate, a third source and a third drain;
a first capacitor comprising a pair of electrodes; and
a display element comprising a first electrode and a second electrode,
wherein the first gate and the second gate are electrically connected to a first wiring,
wherein one of the first source and the first drain is electrically connected to a second wiring,
wherein the other of the first source and the first drain is electrically connected to one of the pair of electrodes of the first capacitor and the third gate,
wherein one of the second source and the second drain is electrically connected to a third wiring,
wherein the other of the second source and the second drain is electrically connected to the other of the pair of electrodes of the first capacitor, one of the third source and the third drain, and the first electrode of the display element,
wherein the other of the third source and the third drain is electrically connected to a fourth wiring,
wherein the first wiring, the second wiring, the third wiring and the fourth wiring are electrically connected to the connection portion,
wherein the connection portion is configured to be attached to or detached from an external driver circuit which is configured to supply a video signal to the second wiring,
wherein the first capacitor is configured to keep a voltage in accordance with the video signal which is supplied from the second wiring, and wherein the display element is configured to perform a display in accordance with the voltage kept in the first capacitor during a period in which the connection portion is not attached to the external driver circuit.

2. The display device according to claim 1,
wherein the connection portion is configured to be attached to a redisplaying circuit which is configured to supply a first potential to the fourth wiring and a second potential to the second electrode of the display element.

3. The display device according to claim 1,
wherein each of the first transistor, the second transistor and the third transistor comprises an oxide semiconductor layer.

4. The display device according to claim 3,
wherein the oxide semiconductor layer comprises indium, gallium and zinc.

5. The display device according to claim 1,
wherein the first transistor and the second transistor are configured to be turned off at the same time.

6. The display device according to claim 1, further comprising:
a fourth transistor comprising a fourth gate, a fourth source and a fourth drain;
a fifth transistor comprising a fifth gate, a fifth source and a fifth drain;
a sixth transistor comprising a sixth gate, a sixth source and a sixth drain; and
a second capacitor comprising a pair of electrodes,
wherein the fourth gate and the fifth gate are electrically connected to a fifth wiring,
wherein one of the fourth source and the fourth drain is electrically connected to the second wiring,
wherein the other of the fourth source and the fourth drain is electrically connected to one of the pair of electrodes of the second capacitor and the sixth gate,
wherein one of the fifth source and the fifth drain is electrically connected to the third wiring,
wherein the other of the fifth source and the fifth drain is electrically connected to the other of the pair of electrodes of the second capacitor, one of the sixth source and the sixth drain, and the first electrode of the display element,
wherein the other of the sixth source and the sixth drain is electrically connected to a sixth wiring, and
wherein the second capacitor is configured to keep a voltage in accordance with an inverted signal of the video signal.

7. A display device comprising:
a first transistor comprising a first gate, a first source and a first drain;
a second transistor comprising a second gate, a second source and a second drain;
a third transistor comprising a third gate, a third source and a third drain;
a first capacitor comprising a pair of electrodes; and
a display element comprising a first electrode and a second electrode,
wherein the first gate and the second gate are electrically connected to a first wiring,
wherein one of the first source and the first drain is electrically connected to a second wiring,
wherein the other of the first source and the first drain is electrically connected to one of the pair of electrodes of the first capacitor and the third gate,
wherein one of the second source and the second drain is electrically connected to a third wiring,
wherein the other of the second source and the second drain is electrically connected to the other of the pair of electrodes of the first capacitor, one of the third source and the third drain, and the first electrode of the display element,
wherein the other of the third source and the third drain is electrically connected to a fourth wiring,
wherein the first capacitor is configured to keep a voltage in accordance with a video signal which is supplied from the second wiring during a period in which the first transistor and the second transistor are turned off,
wherein the display device configured to perform an operation during the period in which the first transistor and the second transistor are turned off and the first capacitor keeps the voltage, and
wherein the operation comprises a first step in which a potential of the second wiring is set to be the same as a potential of the first wiring, a second step performed after the first step in which a potential of the fourth wiring is set to be the same as a potential of the third wiring, and a third step performed after the second step in which supply of potential to the first wiring, the second wiring, the third wiring, and the fourth wiring is stopped after the second step.

8. The display device according to claim 7,
wherein the operation of the display device further includes a fourth step in which a first potential is supplied to the fourth wiring, a second potential is supplied to the second electrode of the display element so that the display element performs a display in accordance with the voltage after the third step.

9. The display device according to claim 8, further comprising:
a fourth transistor comprising a fourth gate, a fourth source and a fourth drain;
a fifth transistor comprising a fifth gate, a fifth source and a fifth drain;
a sixth transistor comprising a sixth gate, a sixth source and a sixth drain; and
a second capacitor comprising a pair of electrodes,
wherein the fourth gate and the fifth gate are electrically connected to a fifth wiring,
wherein one of the fourth source and the fourth drain is electrically connected to the second wiring,
wherein the other of the fourth source and the fourth drain is electrically connected to one of the pair of electrodes of the second capacitor and the sixth gate,
wherein one of the fifth source and the fifth drain is electrically connected to the third wiring,
wherein the other of the fifth source and the fifth drain is electrically connected to the other of the pair of electrodes of the second capacitor, one of the sixth source and the sixth drain, and the first electrode of the display element,
wherein the other of the sixth source and the sixth drain is electrically connected to a sixth wiring,
wherein the second capacitor is configured to keep a voltage in accordance with an inverted signal of the video signal, and
wherein the operation further comprising a fifth step in which a third potential is supplied to the sixth wiring and the second potential is supplied to the second electrode of the display element so that the display element performs a display in accordance with the voltage kept in the second capacitor after the fourth step.

10. The display device according to claim 7,
wherein each of the first transistor, the second transistor and the third transistor comprises an oxide semiconductor layer.

11. The display device according to claim 10,
wherein the oxide semiconductor layer comprises indium, gallium and zinc.

12. The display device according to claim 7,
wherein the first transistor and the second transistor are configured to be turned off at the same time.

13. A driving method of a display device,
the display device comprising:
- a first transistor comprising a first gate, a first source and a first drain;
- a second transistor comprising a second gate, a second source and a second drain;
- a third transistor comprising a third gate, a third source and a third drain;
- a capacitor comprising a pair of electrodes; and
- a display element comprising a first electrode and a second electrode,
- wherein the first gate and the second gate are electrically connected to a first wiring,
- wherein one of the first source and the first drain is electrically connected to a second wiring,
- wherein the other of the first source and the first drain is electrically connected to one of the pair of electrodes of the capacitor and the third gate,
- wherein one of the second source and the second drain is electrically connected to a third wiring,
- wherein the other of the second source and the second drain is electrically connected to the other of the pair of electrodes of the capacitor, one of the third source and the third drain, and the first electrode of the display element,
- wherein the other of the third source and the third drain is electrically connected to a fourth wiring, and
- wherein the second electrode of the display element is electrically connected to a fifth wiring, the driving method comprising the steps of:
- performing a writing operation, the writing operation comprising a step of:
  - setting a potential of the first wiring to a first potential so that the first transistor and the second transistor are turned on and a voltage corresponding to a potential difference between a potential of the second wiring which corresponds to a video signal and a potential of the third wiring is kept in the capacitor; and
- performing a stopping operation after the voltage is kept in the capacitor, the stopping operation comprising:
  - a first step in which the potential of the first wiring is set to be a second potential so that the first transistor and the second transistor are turned off;
  - a second step performed after the first step in which the potential of the second wiring and the potential of the third wiring is set to the second potential;
  - a third step performed after the second step in which a potential of the fourth wiring is set to be the same as a potential of the fifth wiring after the first step; and
  - a fourth step performed after the third step in which supply of potential to the first wiring, the second wiring, the third wiring, and the fourth wiring is stopped after the second step,
- wherein the capacitor keeps the voltage after the stopping operation is performed.

14. The driving method of a display device according to claim 13, further comprising a step of performing a redisplaying operation after the stopping operation,
wherein the redisplaying operation comprising a step of supplying potential to the fourth wiring and the fifth wiring so that the display element performs a display in accordance with the voltage kept in the capacitor.

15. The driving method of a display device according to claim 14, further comprising steps of:
- attaching a driver circuit to the display device at a connection portion of the display device;
- detaching the driver circuit from the display device after the stopping operation; and
- attaching a redisplaying circuit to the display device at the connection portion after the driver circuit is detached,
- wherein the first wiring, the second wiring, the third wiring, the fourth wiring and the fifth wiring are electrically connected to the connection portion,
- wherein the writing operation and the stopping operation are performed by the driver circuit, and
- wherein the redisplaying operation is performed by the redisplaying circuit.

16. The driving method of a display device according to claim 15,
wherein the redisplaying circuit comprising a power supply, a converter and a switch.

17. The driving method of a display device according to claim 14,
wherein the redisplaying operation is performed by a driver circuit, and
wherein the driver circuit is electrically connected to the first wiring, the second wiring, the third wiring, the fourth wiring and the fifth wiring.

18. The driving method of a display device according to claim 13,
wherein each of the first transistor, the second transistor and the third transistor comprises an oxide semiconductor layer.

19. The driving method of a display device according to claim 18,
wherein the oxide semiconductor layer comprises indium, gallium and zinc.

* * * * *